(12) United States Patent
Baek et al.

(10) Patent No.: US 12,261,076 B2
(45) Date of Patent: Mar. 25, 2025

(54) WAFER PROCESSING APPARATUS AND WAFER PROCESSING METHOD

(71) Applicant: ZEUS CO., LTD., Hwaseong-si (KR)

(72) Inventors: Seung Dae Baek, Hwaseong-si (KR); Sung Yup Kim, Suwon-si (KR); Jun Goo Park, Hwaseong-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 397 days.

(21) Appl. No.: 17/720,760

(22) Filed: Apr. 14, 2022

(65) Prior Publication Data

US 2022/0344196 A1    Oct. 27, 2022

(30) Foreign Application Priority Data

Apr. 21, 2021   (KR) .................. 10-2021-0051543

(51) Int. Cl.
*B08B 3/12*          (2006.01)
*H01L 21/683*        (2006.01)

(52) U.S. Cl.
CPC .......... *H01L 21/6838* (2013.01); *B08B 3/12* (2013.01)

(58) Field of Classification Search
CPC ... B08B 3/12; B08B 3/024; B08B 3/02; B01J 19/10; A47L 15/13; A61C 17/20; H01L 21/6838; H01L 21/683; H01L 21/67051; H01L 21/67; H01L 21/67092; H01L 21/67132; H01L 21/68707; H01L 21/687; H01L 21/68728; H01L 21/67253; H01L 21/677; H01L 21/6776; H01L 21/02076; H01L 21/02; H01L 21/67144; H01L 21/672; H01L 21/6836; H01L 2221/68336; H01L 21/67742; H01L 21/67207

See application file for complete search history.

(56) References Cited

U.S. PATENT DOCUMENTS

| 8,062,929 | B2 * | 11/2011 | Do ........................ H01L 25/03 257/E23.129 |
| 9,269,624 | B2 * | 2/2016 | Nakamura ........ H01L 21/67092 |
| 9,972,575 | B2 * | 5/2018 | Park ...................... H01L 23/544 |
| 10,026,605 | B2 * | 7/2018 | Doub ...................... H01L 21/78 |
| 2010/0233852 | A1 * | 9/2010 | Do ....................... H01L 21/6836 438/109 |
| 2015/0364375 | A1 * | 12/2015 | Nakamura .......... H01L 21/6836 438/462 |
| 2020/0098635 | A1 * | 3/2020 | Jeon ........................ H01L 21/56 |
| 2021/0183703 | A1 * | 6/2021 | Day ................... H01L 21/67115 |
| 2022/0199411 | A1 * | 6/2022 | Takasaki .......... H01L 21/31116 |
| 2023/0405762 | A1 * | 12/2023 | Yamaguchi ............... B08B 3/02 |

FOREIGN PATENT DOCUMENTS

KR   10-2016-0122067   10/2016

* cited by examiner

*Primary Examiner* — Nikolay K Yushin
(74) *Attorney, Agent, or Firm* — KILE PARK REED & HOUTTEMAN PLLC

(57) ABSTRACT

A wafer processing apparatus of the present invention includes a first chamber unit in which a first wafer part including a retainer ring portion and a plurality of sawn first dies is processed, a second chamber unit in which a second wafer part including a wafer part or a carrier substrate is processed, and a third chamber unit in which the first dies of the first wafer part processed in the first chamber unit and the second wafer part processed in the second chamber unit are stacked and pre-bonded.

20 Claims, 25 Drawing Sheets

WAFER PROCESSING APPARATUS AND WAFER PROCESSING METHOD

CROSS-REFERENCE TO RELATED APPLICATION

This application claims the benefit under 35 U.S.C. § 119(a) of Korean Patent Application No. 10-2021-0051543, filed on Apr. 21, 2021 in the Korean Intellectual Property Office, the entire disclosure of which is incorporated herein by reference for all purposes.

BACKGROUND

Technical Field

The present invention relates to a wafer processing apparatus and a wafer processing method, and more particularly, to a wafer processing apparatus capable of improving wafer processing performance and reducing a wafer processing time, and a wafer processing method.

Discussion of the Background

In general, in a semiconductor process, an etching process of etching wafers, a singulation process of sawing the wafers into a plurality of dies, and a cleaning process of cleaning the wafers are performed. A wafer processing apparatus is used in the wafer etching process or the cleaning process.

The wafer processing apparatus includes a rotary table which is rotatably installed and on which a wafer is mounted, and a sealing ring coupled to an edge area of the rotary table in a ring shape. A processing solution is supplied onto the wafer mounted on the rotary table while the rotary table rotates.

However, in the conventional wafer processing apparatus, when a wafer in which a plurality of dies are sawn is cleaned, it may be difficult to remove foreign materials remaining in gaps between the plurality of dies. In addition, since a cleaning time should be sufficiently extended in order to remove the foreign materials from the gaps between the plurality of dies, the cleaning time can increase.

In addition, a process of coupling a sealing ring to an upper portion of a rotary table is cumbersome, and a coupling completion state of the sealing ring is not constant when the sealing ring is coupled, resulting in a coupling error (distortion or the like). Furthermore, when the coupling error of the sealing ring is caused, a processing solution may permeate into a part outside the sealing ring, and thus, a structure at a circumferential portion of the table may be damaged.

In addition, a wafer fixing module is installed to prevent a position of a wafer from being shifted, and a sealing ring fixing module is installed to fix the sealing ring. Accordingly, the structure of the wafer processing apparatus may become complicated, and manufacturing costs thereof can increase.

A background technique of the present invention is disclosed in Korean Patent Publication No. 10-2016-0122067 (published on Oct. 21, 2016, and titled "Wafer processing apparatus and sealing ring for wafer processing apparatus").

SUMMARY OF THE INVENTION

The present invention is directed to providing wafer processing apparatus capable of improving wafer processing performance and reducing a wafer processing time, and a wafer processing method.

According to an aspect of the present invention, there is provided a wafer processing apparatus including a first chamber unit in which a first wafer part including a retainer ring portion and a plurality of sawn first dies is processed, a second chamber unit in which a second wafer part including a wafer part or a carrier substrate is processed, and a third chamber unit in which the first dies of the first wafer part processed in the first chamber unit and the second wafer part processed in the second chamber unit are stacked and pre-bonded.

In the third chamber unit, the plurality of first dies may be stacked and pre-bonded for each second die of the second wafer part.

Whenever one layer of the first dies is stacked and pre-bonded for each second die, the first wafer part may be cleaned in the first chamber unit, or the second wafer part may be cleaned in the second chamber unit.

The second chamber unit may include a second vacuum chuck unit on which the second wafer part is mounted, and a second ultrasonic cleaning module configured to spray a cleaning solution onto the second wafer part and apply ultrasonic waves to the cleaning solution to ultrasonically vibrate the cleaning solution.

The wafer processing apparatus may further include a transfer unit disposed in the first chamber unit and configured to receive the first wafer part from a first transfer module and mount the first wafer part on a first vacuum chuck unit.

The wafer processing apparatus may further include a first ionizer disposed in the first chamber unit, and a second ionizer disposed in the second chamber unit.

The first chamber unit may further include an expander module, and the expander module may include an expander moving part disposed in the first chamber unit, an expander head installed at the expander moving part, and a plurality of expander arms connected to the expander head to hold and move a ring cover unit and configured to press the ring cover unit such that a chucking module restrains the ring cover unit to a first vacuum chuck unit.

The expander head may include an expander casing connected to the expander moving part, a plurality of expander sliders coupled to the expander casing to be radially movable and each connected to one of the expander arms, an expander rod disposed inside the expander casing to move the plurality of expander sliders, and an expander driving part disposed in the expander casing to move the expander rod.

The expander casing may include a casing body having a movement space, in which the expander rod moves, formed therein, a first blocking plate configured to block one side of the casing body, and a second blocking plate which blocks the other side of the casing body and has a movement hole, into which the expander rod is movably inserted, formed therein.

The expander rod may include a moving disk portion movably installed in a movement space of the expander casing, a plunger portion connected to the moving disk portion to be inserted into a movement hole of the expander casing, and a push portion connected to the plunger portion and the expander slider to move the expander slider as the plunger portion moves.

The expander driving part may include a first supply port configured to supply a driving medium to one side of the movement space to move the moving disk portion toward the expander slider and a second supply port configured to supply the driving medium to the other side of the movement space to move the moving disk portion in a direction opposite to the expander slider.

The expander arm may include an arm member connected to the expander slider, and a catch portion disposed at the arm member to restrain the ring cover unit.

The catch portion may include a catch body connected to the arm member to surround an outer side of the ring cover unit and a catch pin coupled to the catch body to be inserted into a cover hole of the ring cover unit.

The chucking module may include a chucking base installed in the first vacuum chuck unit, a chucking rotating part connected to the chucking base to rotate the chucking base, a plurality of chucking link parts which are each radially connected to the chucking base and move when the chucking base rotates, and a plurality of cover restraining parts each connected to one of the chucking link parts to restrain the ring cover unit to the first vacuum chuck unit when the chucking link parts move.

A plurality of guide portions may be formed to be inclined with respect to a radial direction of the base body, and the chucking link parts may be movably coupled to the guide portions.

The chucking link part may include a guide slider movably coupled to the chucking base, a link member connected to the guide slider and installed to move linearly in a radial direction of the chucking base when the guide slider moves, and a link gear portion formed on the link member to move by being engaged with the cover restraining part.

The cover restraining part may include a cover restraining shaft portion rotatably installed in the vacuum chuck unit, a restraining gear portion formed on the cover restraining shaft portion to be engaged with the link gear portion, a cover restraining bar connected to the cover restraining shaft portion to press and release the ring cover unit, and a restraining roller rotatably installed on the cover restraining bar to be in rolling contact with the ring cover unit.

The first chamber unit may include a first ultrasonic cleaning module, and the first ultrasonic cleaning module may include a lifting arm driving part, a lifting arm connected to the lifting arm driving part to be vertically moved by the lifting arm driving part, a swing part connected to the lifting arm to rotate the lifting arm, and an ultrasonic cleaning part connected to the lifting arm and configured to spray a cleaning solution onto the first wafer part and apply ultrasonic waves to the cleaning solution.

The ultrasonic cleaning part may include a cleaning head connected to the lifting arm and immersed in the cleaning solution, an ultrasonic wave generator disposed inside the cleaning head to apply the ultrasonic waves to the cleaning solution, a voltage applying part disposed inside the cleaning head to apply a voltage to the ultrasonic wave generator, an internal pressure forming part configured to form pressure higher than atmospheric pressure inside the cleaning head, and a cleaning solution spray part formed in the cleaning head to spray the cleaning solution onto the first wafer part.

An inflow side of a lower surface of the cleaning head into which the cleaning solution flows may be formed at a higher level than an outflow side thereof of which the cleaning solution flows out.

The cleaning head may be installed such that a height of a lower surface of one side of the cleaning head is adjusted according to a change in height of the first wafer part.

According to another aspect of the present invention, there is provided a wafer processing method including processing a first wafer part including a retainer ring portion and a plurality of sawn first sawn dies in a first chamber unit, processing a second wafer part including a wafer part and a carrier substrate in a second chamber unit, and stacking and pre-bonding the first dies processed in the first chamber unit and the second wafer part processed in the second chamber unit in a third chamber unit.

In the third chamber unit, the plurality of first dies may be stacked and pre-bonded for each second die of the second wafer part.

Whenever one layer of the first dies is stacked and pre-bonded for each of the second dies, the first wafer part may be cleaned in the first chamber unit, or the second wafer part may be cleaned in the second chamber unit.

In the first chamber unit, a first ultrasonic cleaning module sprays a cleaning solution onto the first wafer part and applies ultrasonic waves to the cleaning solution to ultrasonically vibrate the cleaning solution.

An internal pressure forming part of the first ultrasonic cleaning module may form pressure higher than atmospheric pressure inside a cleaning head.

An inflow side of a lower surface of the cleaning head into which the cleaning solution flows may be formed at a higher level than an outflow side thereof of which the cleaning solution flows out.

The cleaning head may be installed such that a height of a lower surface of one side of the cleaning head is adjusted according to a change in height of the first wafer part.

In the second chamber unit, a second ultrasonic cleaning module sprays a cleaning solution onto the second wafer part and applies ultrasonic waves to the cleaning solution to ultrasonically vibrate the cleaning solution.

A first ionizer of the first chamber unit may spray deionized water (DIW) including positive ions and negative ions onto the first wafer part to remove static electricity.

A second ionizer of the second chamber unit may spray DIW including positive ions and negative ions onto the second wafer part to remove static electricity.

DETAILED DESCRIPTION OF EXEMPLARY EMBODIMENTS

Figure 1:
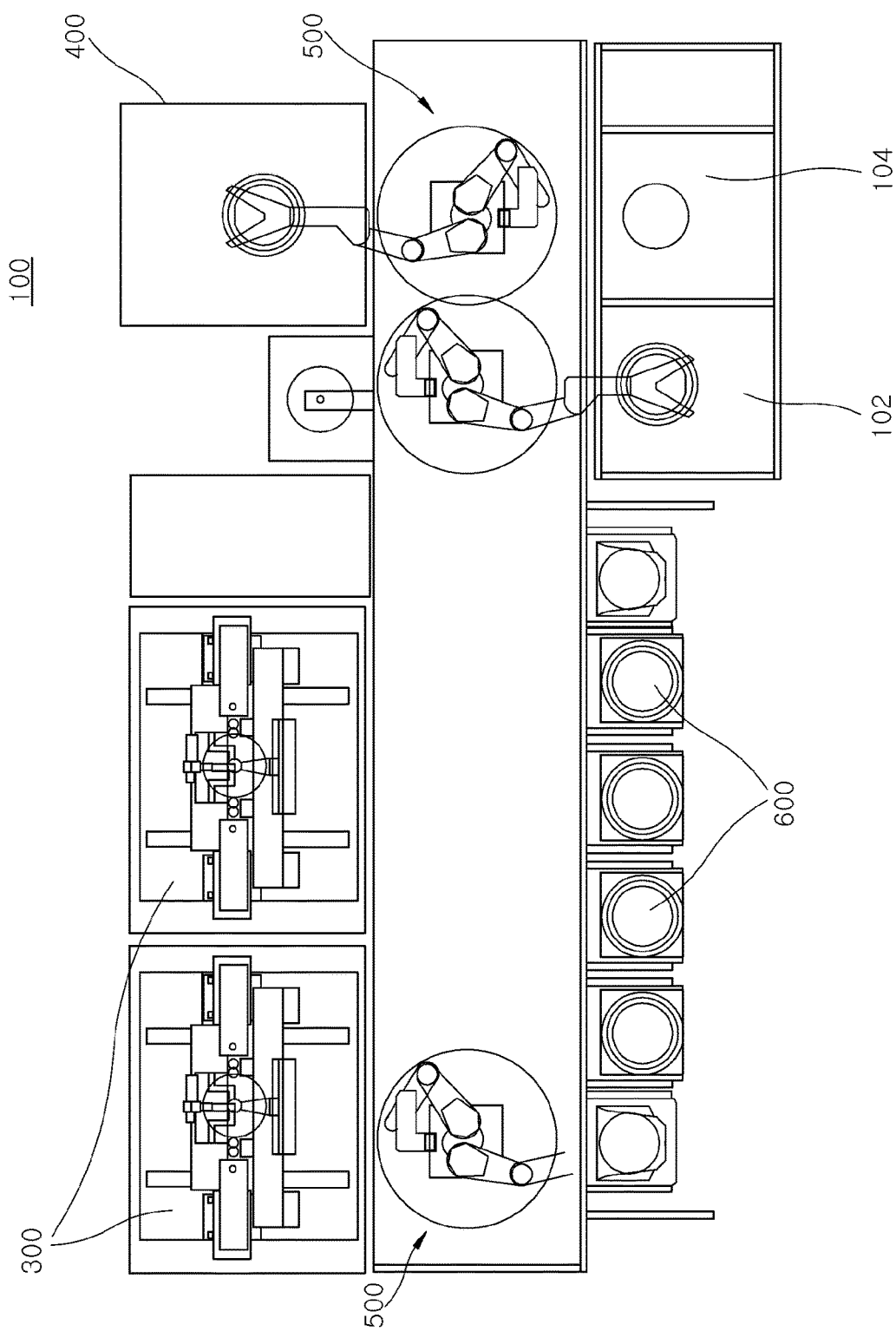
FIG. 1 is a schematic configuration view illustrating a wafer processing apparatus according to one embodiment of the present invention.

Hereinafter, embodiments of a wafer processing apparatus and a wafer processing method according to the present invention will be described with reference to the accompanying drawings. In describing the wafer processing apparatus and the wafer processing method, thickness of lines or sizes of components shown in the drawings may be exaggerated for the sake of convenience and clarity in description. Furthermore, terms used herein are defined by taking functions of the present invention into account and may be changed according to a custom or the intent of a user or an operator. Accordingly, the terminologies should be defined based on the following overall description of the present specification.

Figure 2:
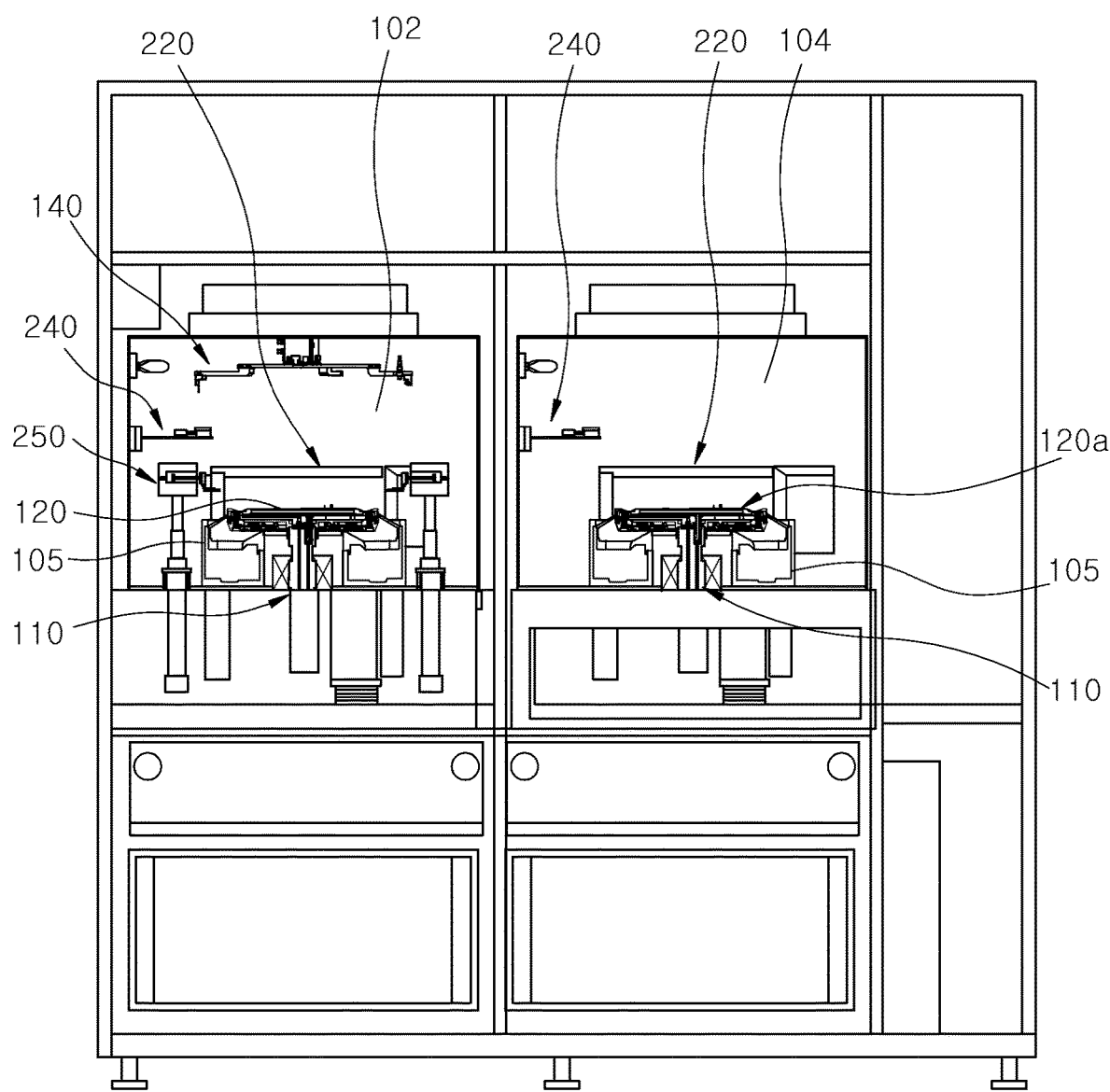
FIG. 2 is a schematic configuration view illustrating a first chamber unit and a second chamber unit of the wafer processing apparatus according to one embodiment of the present invention.
Figure 3:
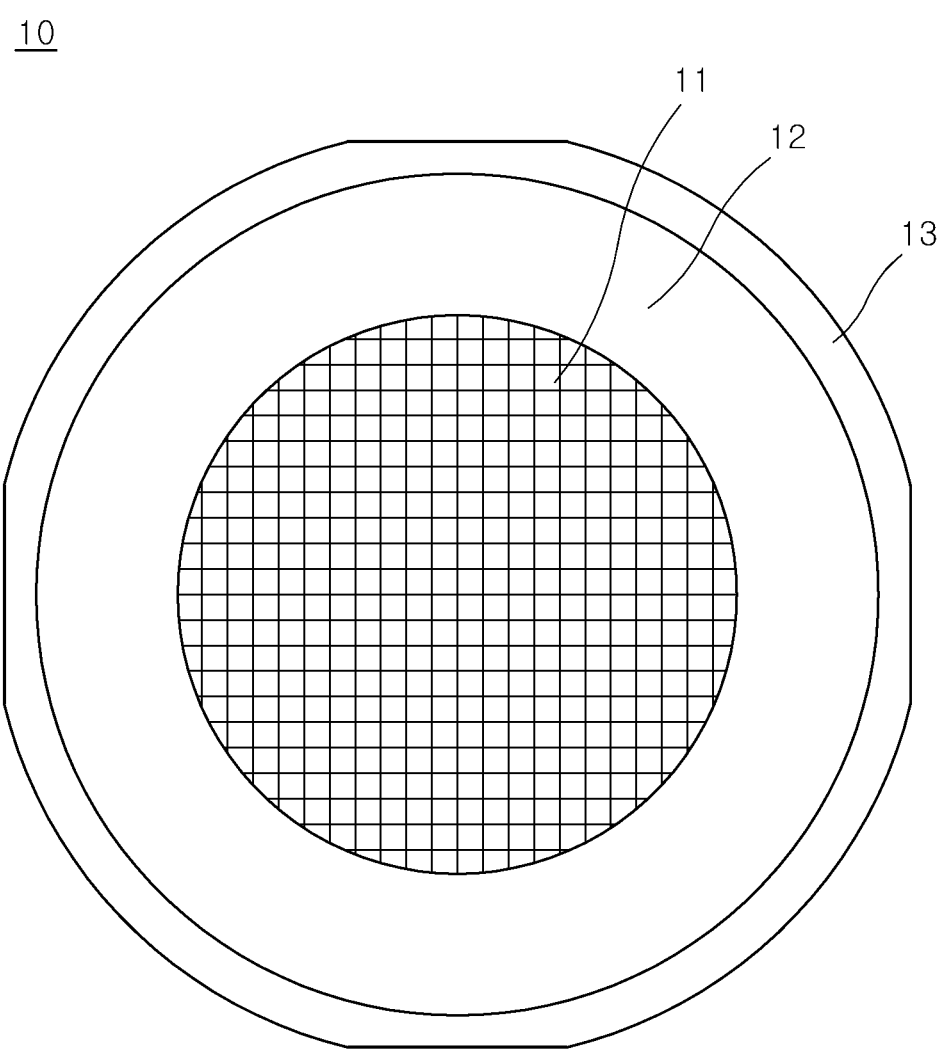
FIG. 3 is a schematic plan view illustrating a first wafer part to be processed in the first chamber unit of the wafer processing apparatus according to one embodiment of the present invention.
Figure 4:
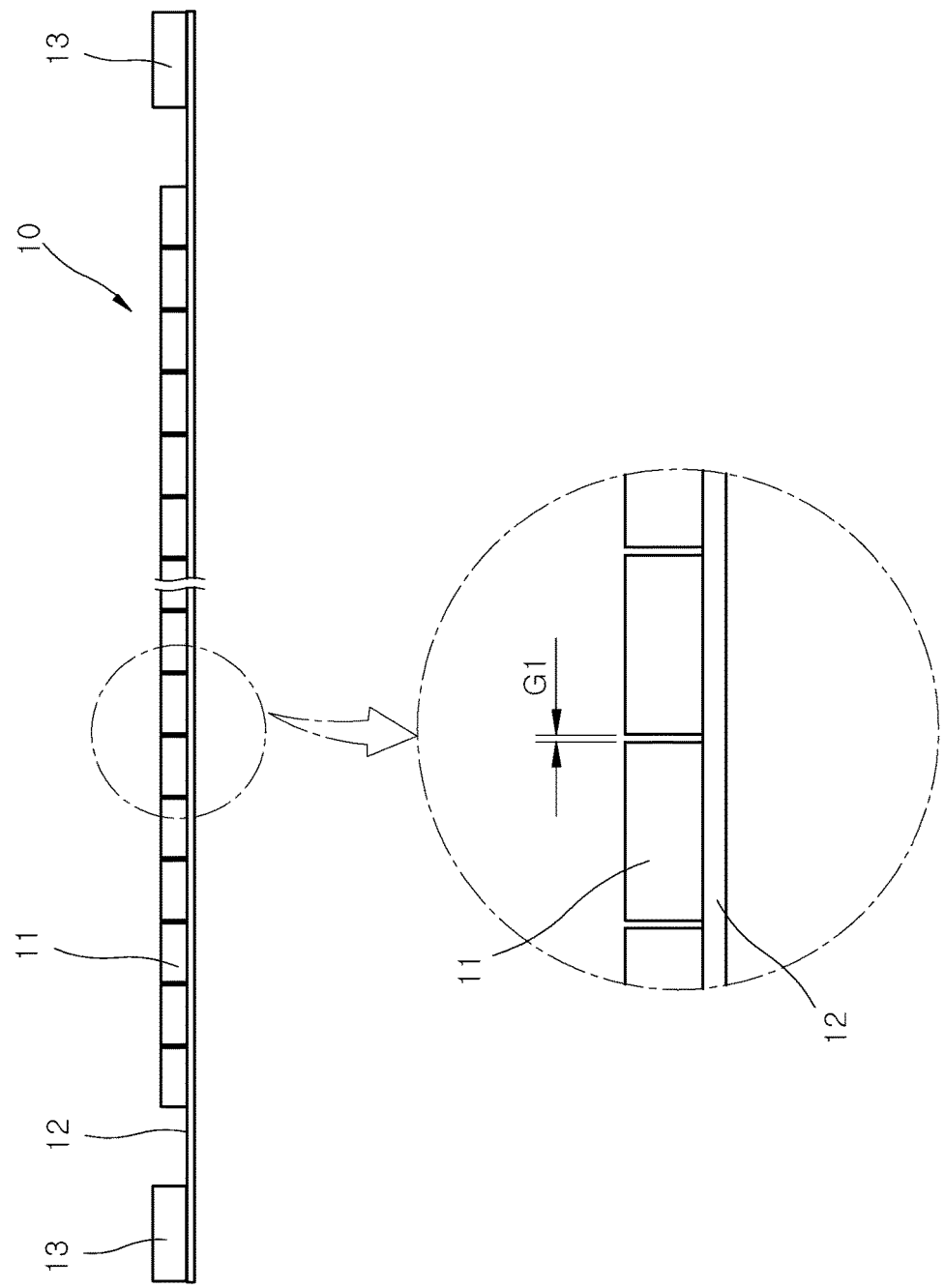
FIG. 4 shows schematic side views illustrating the first wafer part to be processed in the first chamber unit of the wafer processing apparatus according to one embodiment of the present invention.
Figure 5:
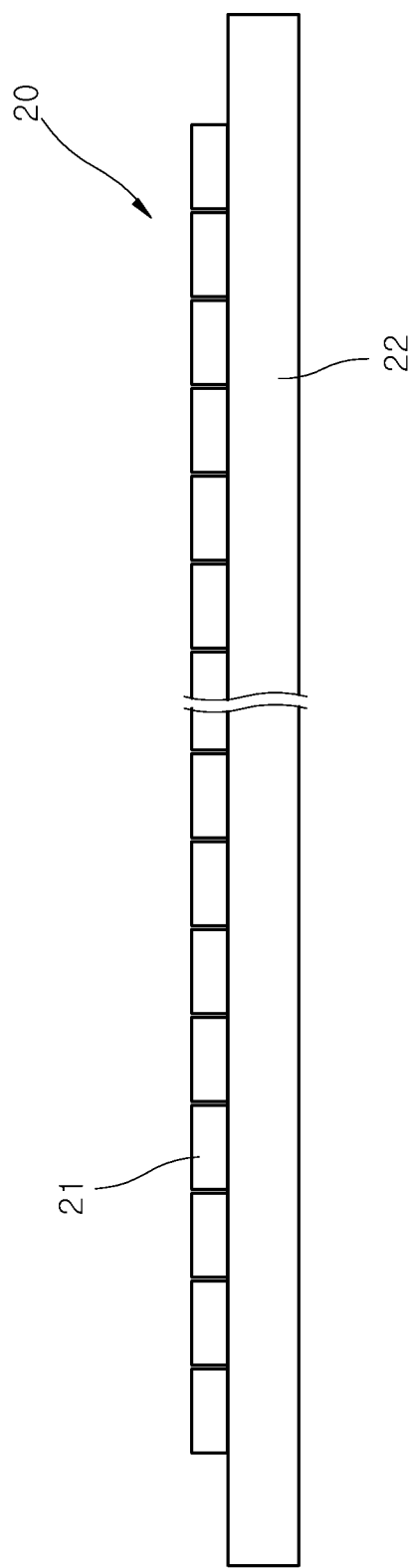
FIG. 5 is a schematic side view illustrating a second wafer part to be processed in the second chamber unit of the wafer processing apparatus according to one embodiment of the present invention.
Figure 6:
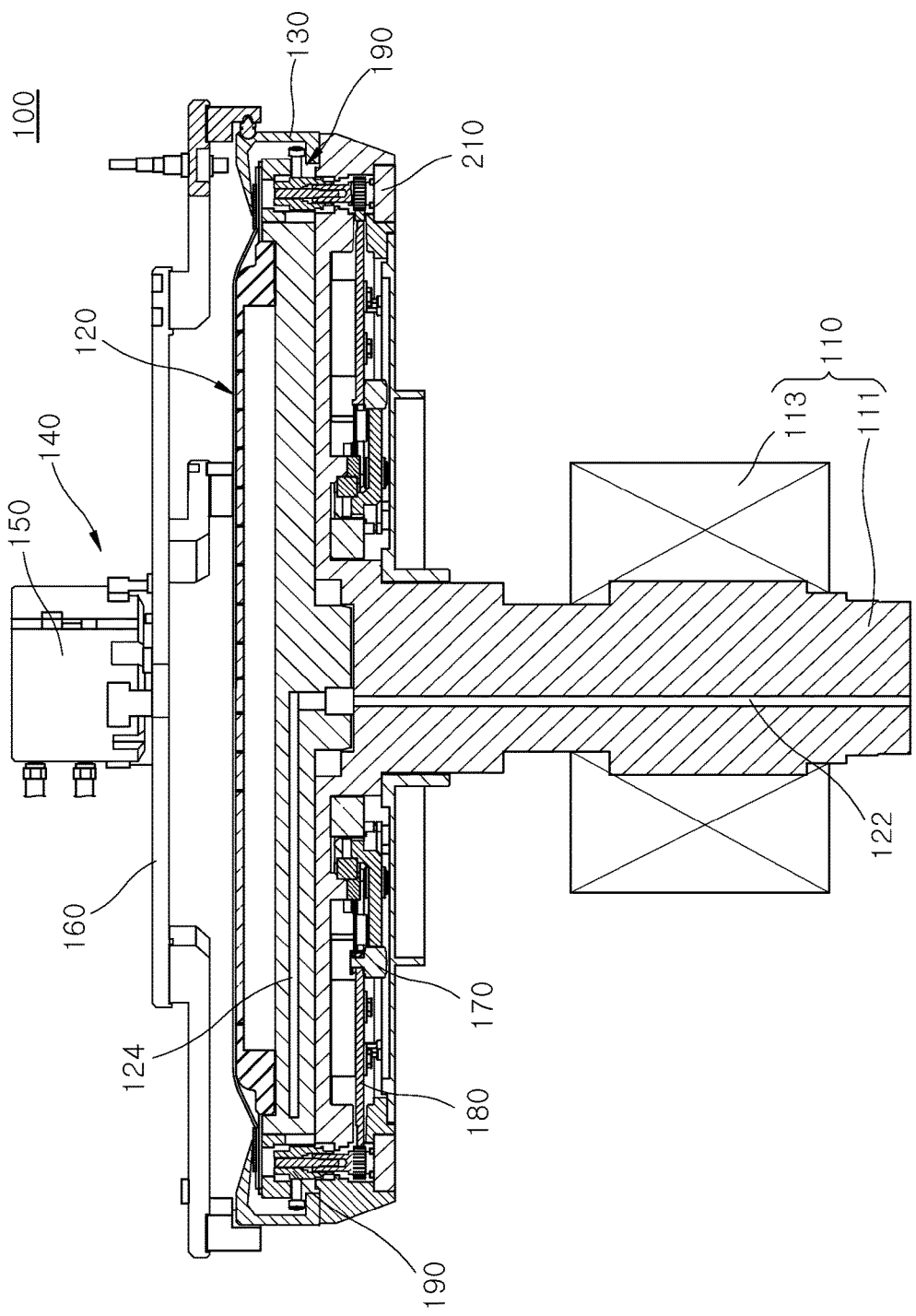
FIG. 6 is a schematic side view illustrating a first vacuum chuck unit of the wafer processing apparatus according to one embodiment of the present invention.

FIG. 1 is a schematic configuration view illustrating a wafer processing apparatus according to one embodiment of the present invention. FIG. 2 is a schematic configuration view illustrating the wafer processing apparatus according to one embodiment of the present invention. FIG. 3 is a schematic plan view illustrating a first wafer part to be processed in a first chamber unit of the wafer processing apparatus according to one embodiment of the present invention. FIG. 4 shows schematic side views illustrating the first wafer part to be processed in the first chamber unit of the wafer processing apparatus according to one embodiment of the present invention. FIG. 5 is a schematic side view illustrating a second wafer part to be processed in a second chamber unit of the wafer processing apparatus according to one embodiment of the present invention. FIG. 6 is a schematic side view illustrating a first vacuum chuck unit of the wafer processing apparatus according to one embodiment of the present invention.

Referring to FIGS. 1 to 6, a wafer processing apparatus 100 according to one embodiment of the present invention includes a first chamber unit 102, a second chamber unit 104, and a third chamber unit 300.

A first wafer part 10 including a retainer ring portion 13 and a plurality of sawn first dies 11 is processed in the first chamber unit 102. In this case, the first wafer part 10 is cleaned in the first chamber unit 102.

A second wafer part 20 including a wafer part or a carrier substrate is processed in the second chamber unit 104. In this case, the second wafer part 20 is cleaned in the second chamber unit 104.

The first dies 11 of the first wafer part 10 processed in the first chamber unit 102 and the second wafer part 20 processed in the second chamber unit 104 are stacked and pre-bonded in the third chamber unit 300.

A plurality of third chamber units 300 are installed such that the first wafer part 10 and the second wafer part 20 are individually stacked and pre-bonded. After the first wafer part 10 is position-aligned at an accurate position in the third chamber unit 300, the second wafer part 20 is stacked and pre-bonded.

In this case, in the third chamber unit 300, the first dies 11 of the first wafer part 10 and the second wafer part 20 are pre-bonded at a temperature of about 20° C. to 30° C., water (deionized water (DIW)) attached to the first wafer part 10 and the second wafer part 20 is evaporated to shield solder portions (not shown) of the first wafer part 10 and the second wafer part 20 from oxygen. Accordingly, the solder portion including a copper material is prevented from coming into contact with oxygen, thereby preventing the corrosion of the solder portion.

The above-described pre-bonding means that, in the third chamber unit 300, the stacked first dies 11 are processed with plasma to clean the first dies 11 with water (DIW), and water renders surfaces of the first dies 11 hydrophilic to attach the first dies 11 with a force of water molecules. In this case, the stacked first dies are bonded through an oxide-oxide bond during pre-bonding. Meanwhile, bonding means that copper components and the like of the solder portions are bonded in the stacked first dies through annealing in a separate chamber unit.

Since the first wafer part 10 is processed in the first chamber unit 102 and the second wafer part 20 is processed in the second chamber unit 104, the first wafer part 10 and the second wafer part 20 may be simultaneously supplied to the third chamber unit 300. Accordingly, the first wafer part 10 and the second wafer part 20 can be stacked and pre-bonded in the third chamber unit 300, thereby considerably improving the processing speed and performance with respect to a substrate.

In the third chamber unit 300, the plurality of first dies 11 are stacked and pre-bonded on second dies 21 of the second wafer part 20. Accordingly, the second wafer part 20 constitutes a base of an integrated circuit, and a plurality of layers of the first dies 11 are integrated on the second wafer part 20.

Whenever one layer of the first dies 11 is stacked and pre-bonded for each second die 21 of the second wafer part 20 in the third chamber unit 300, the first wafer part 10 is cleaned in the first chamber unit 102, or the second wafer part 20 is cleaned in the second chamber unit 104. Accordingly, it is possible to remove foreign materials generated whenever one layer of the first dies 11 is stacked for each second die 21.

A plasma chamber unit 400 is installed near the first chamber unit 102, the second chamber unit 104, and the third chamber unit 300. The first wafer part 10 and the second wafer part 20 are supplied to the plasma chamber unit 400 after water is removed therefrom in the first chamber unit 102 and the second chamber unit 104 or a separate dry chamber (not shown). In the plasma chamber unit 400, the first wafer part 10 and the second wafer part 20 are processed with plasma. Foreign materials may be generated during a process of processing the first wafer part 10 and the second wafer part 20. The foreign materials permeate into a silicon surface to change resistivity or conductivity, thereby having a fatal effect on the electrical characteristics of an integrated circuit. Accordingly, the first wafer part 10 and the second wafer part 20 are processed with plasma in the plasma chamber unit 400 to form a protective film on the first wafer part 10 and the second wafer part 20.

Wafer part loading units 600 are disposed at one side of the first chamber unit 102 and the second chamber unit 104 such that the first wafer part 10 and the second wafer part 20 are stacked. In addition, the first wafer part 10 and the second wafer part 20 are transferred from the wafer part loading units 600 to the first chamber unit 102, the second chamber unit 104, the third chamber unit 300, and the plasma chamber unit 400 by a plurality of transfer robots 500.

For example, the transfer robot 500 picks up the first wafer part 10 or the second wafer part 20 from the wafer part loading unit 600 and supplies the first wafer part 10 or the second wafer part 20 to the plasma chamber unit 400. The first wafer part 10 or the second wafer part 20, which is processed with plasma in the plasma chamber unit 400, is transferred to the first chamber unit 102 or the second chamber unit 104 by the transfer robot 500. The first wafer part 10 or the second wafer part 20 cleaned in the first chamber unit 102 or the second chamber unit 104 is supplied to the third chamber unit 300 by the transfer robot 500. That is, whenever one layer of the first dies 11 of the first wafer part 10 is stacked and pre-bonded on the second dies 21 of the second wafer part 20, the transfer robot 500 circulates a stacked wafer part in the order of the first chamber unit 102 (or the second chamber unit 104), the plasma chamber unit 400, and the third chamber unit 300. Such a circulation process is repeated to manufacture the stacked wafer part.

When a process of stacking the plurality of layers of the first dies 11 on the second dies 21 of the second wafer part 20 is completed, the stacked wafer part is sawn into unit semiconductor chips in a sawing process.

The first chamber unit 102 includes a first vacuum chuck unit 120, a ring cover unit 130, an expander module 140, a chucking module 170, and a first ultrasonic cleaning module 220.

The first chamber unit 102 is disposed inside a case 101. The first chamber unit 102 is shielded from the outside to prevent leakage of a cleaning solution therein.

The second chamber unit 104 includes a second vacuum chuck unit 120a and a second ultrasonic cleaning module 220.

The second chamber unit 104 is disposed at one side of the first chamber unit 102. The second chamber unit 104 is shielded from the outside to prevent leakage of a cleaning solution therein.

The wafer processing apparatus 100 cleans the first wafer part 10 and the second wafer part 20. The first wafer part 10 is loaded into the first chamber unit 102, and the second wafer part 20 is loaded into the second chamber unit 104.

The first wafer part 10 etched in an etching process is sawn in the form of a matrix in a singulation process to form the plurality of first dies 11. In a cleaning process, a cleaning solution is sprayed onto the first wafer part 10 to remove foreign materials attached to the plurality of first dies 11. As the cleaning solution, various types of a cleaning solution such as DIW may be applied. The cleaning solution and the like supplied to the first chamber unit 102 and the second chamber unit 104 will be collectively referred to as a supply solution.

The first wafer part 10 includes the plurality of dies 11 arranged in the form of a matrix, an adhesive sheet 12 to which the plurality of dies 11 are attached, and the retainer ring portion 13 connected to a circumferential portion of the adhesive sheet 12 to tightly support the adhesive sheet 12. The adhesive sheet 12 is made of a material that is stretchable or contractible in a horizontal direction. The adhesive sheet 12 is pulled tight by the retainer ring portion 13 so that the plurality of dies 11 are positioned and fixed, and the die 11, which is a thin plate, maintains a flat plate shape.

The second wafer part 20 may be a wafer part in which the second dies 21 are not sawn or may be a wafer part stacked on a carrier 22. FIG. 5 illustrates the second wafer part 20 in which the plurality of second dies 21, which are not sawn, are arranged in the form of a matrix on the carrier 22 such as a glass substrate. A retainer ring portion 13 is not installed at a circumferential portion of the second wafer part 20.

A cup housing 105 (see FIG. 2) is installed in the first chamber unit 102. The first vacuum chuck unit 120 is disposed inside the cup housing 105 in which a supply solution such as a cleaning solution is accommodated. The cup housing 105 is installed to surround an outer side of the first vacuum chuck unit 120. The cleaning solution sprayed from the cup housing 105 may be prevented from being discharged or scattered to the outside by the cup housing 105.

The first vacuum chuck unit 120 is installed to be rotatable by a driving unit 110. The entirety of the first vacuum chuck unit 120 may be formed in a disk shape.

The driving unit 110 includes a rotating shaft 111 connected to a rotation center of the first vacuum chuck unit 120 and a motor unit 113 installed on the rotating shaft 111. The motor unit 113 includes a stator (not shown) installed inside a housing (not shown) and a rotor (not shown) disposed inside the stator and installed to surround the rotating shaft 111. In addition, as the driving unit 110, a belt driving type for rotating the rotating shaft 111 through a belt or a chain driving type for rotating the rotating shaft 111 through a chain may be applied. As long as the driving unit 110 rotates the vacuum chuck unit 120, various forms may be applied.

A vacuum flow path 122 is formed in the rotating shaft 111 to vacuumize the first vacuum chuck unit 120. The vacuum flow path 122 is formed in a length direction of the rotating shaft 111. A vacuum chamber 124 is formed in the first vacuum chuck unit 120 to be connected to the vacuum flow path 122. A plurality of vacuum holes (not shown) are formed in the first vacuum chuck unit 120 to apply vacuum pressure to the first wafer part 10. The first vacuum chuck unit 120 may be formed in various ways.

The first wafer part 10 is mounted on the first vacuum chuck unit 120. The first wafer part 10 in a state in which the plurality of first dies 11 are sawn is mounted on the first vacuum chuck unit 120. When the first wafer part 10 is sawn into the dies 11, foreign materials may remain on surfaces of the dies 11 and in gaps between the dies 11.

The ring cover unit 130 faces the retainer ring portion 13 of the first wafer part 10. The ring cover unit 130 includes a cover body 131 formed to surround a circumferential portion of the vacuum chuck unit 120, a restraining stepped portion 132 formed to protrude inward from a lower side of the cover body 131, and a cover pressing portion 133 which extends inward from an upper side of the cover body 131 and presses the retainer ring portion 13 of the first wafer part 10. The cover pressing portion 133 may be formed such that a thickness thereof is gradually decreased toward an end thereof. Since the cover pressing portion 133 seals an upper surface of the retainer ring portion 13, a cleaning solution can be prevented from permeating into parts outside the retainer ring portion 13.

The expander module 140 is installed to move the ring cover unit 130 and presses the retainer ring portion 13 toward the first vacuum chuck unit 120 to widen the gaps between the first dies 11 in the first wafer part 10.

The chucking module 170 is installed in the first vacuum chuck unit 120 to fix the retainer ring portion 13 of the first wafer part 10 to the first vacuum chuck unit 120. The chucking module 170 presses the retainer ring portion 13 downward to fix the retainer ring portion 13 to the circumferential portion of the vacuum chuck unit 120. Therefore, when the vacuum chuck unit 120 rotates, the chucking module 170 presses the ring cover unit 130 and the retainer ring portion 13 to prevent a position change of the first wafer part 10 and allow the first wafer part 10 to maintain a flat state. The chucking module 170 will be described in detail below.

Figure 7A:
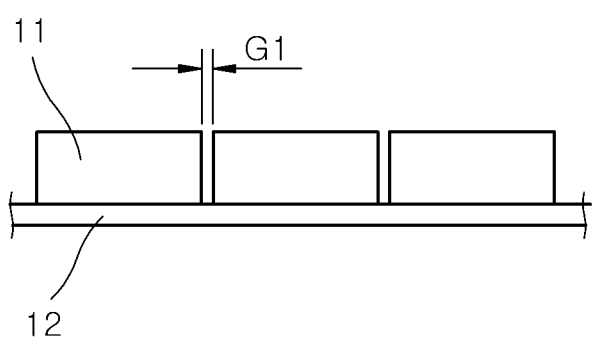
FIGS. 7A and 7B show schematic side views illustrating a state in which an expander module is lowered to press a ring cover unit and a retainer ring portion and widen gaps between a plurality of first dies in the wafer processing apparatus according to one embodiment of the present invention.
Figure 7B:
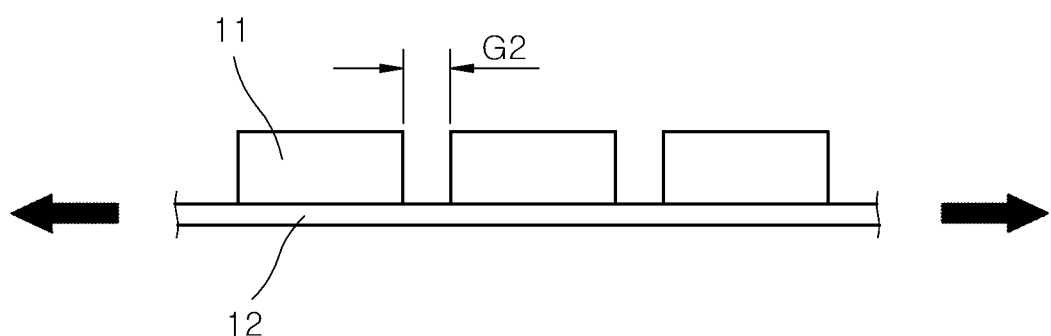
Figure 8:
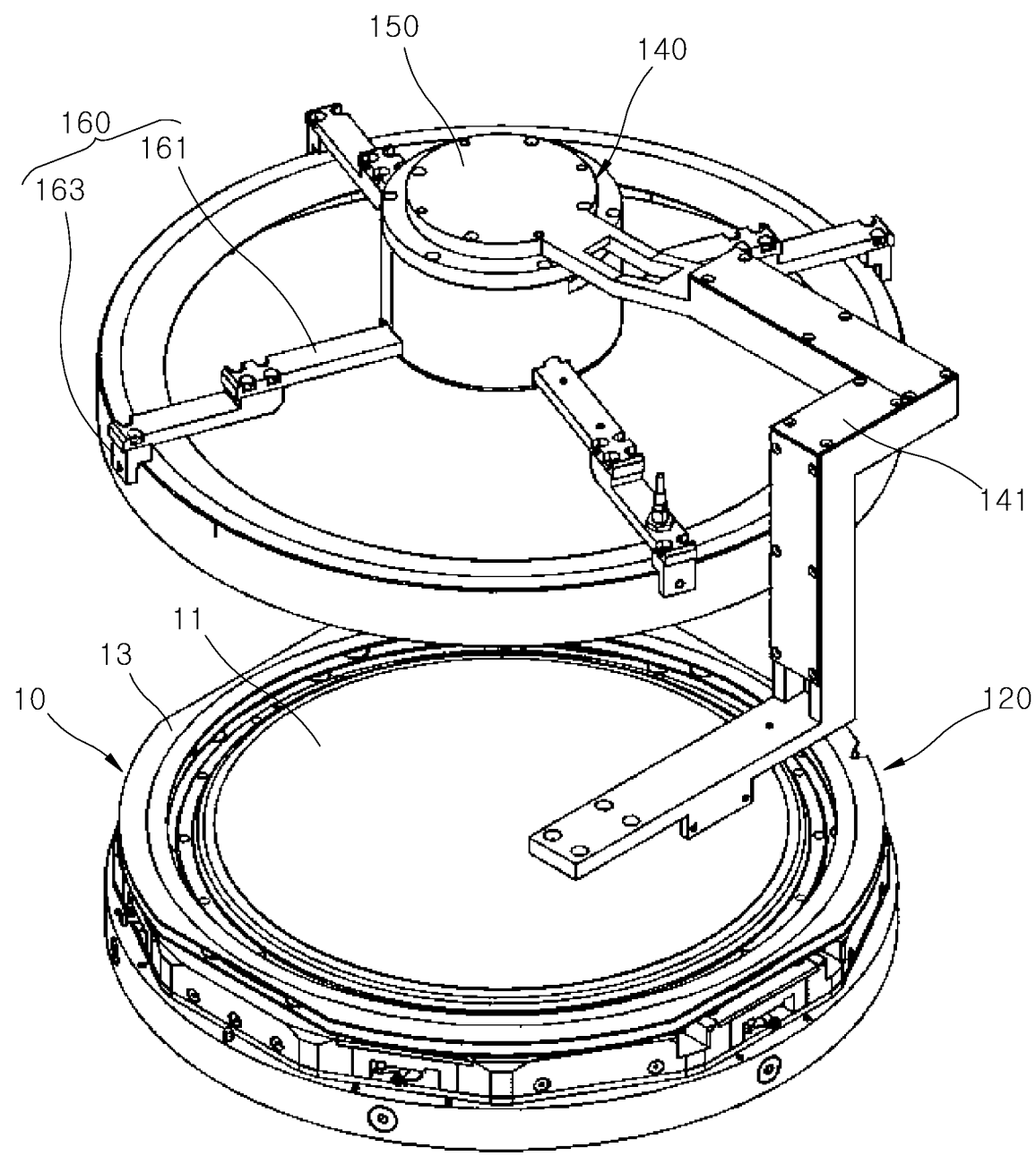
FIG. 8 is a schematic perspective view illustrating a state in which the expander module holds and moves the ring cover unit in the wafer processing apparatus according to one embodiment of the present invention.
Figure 9:
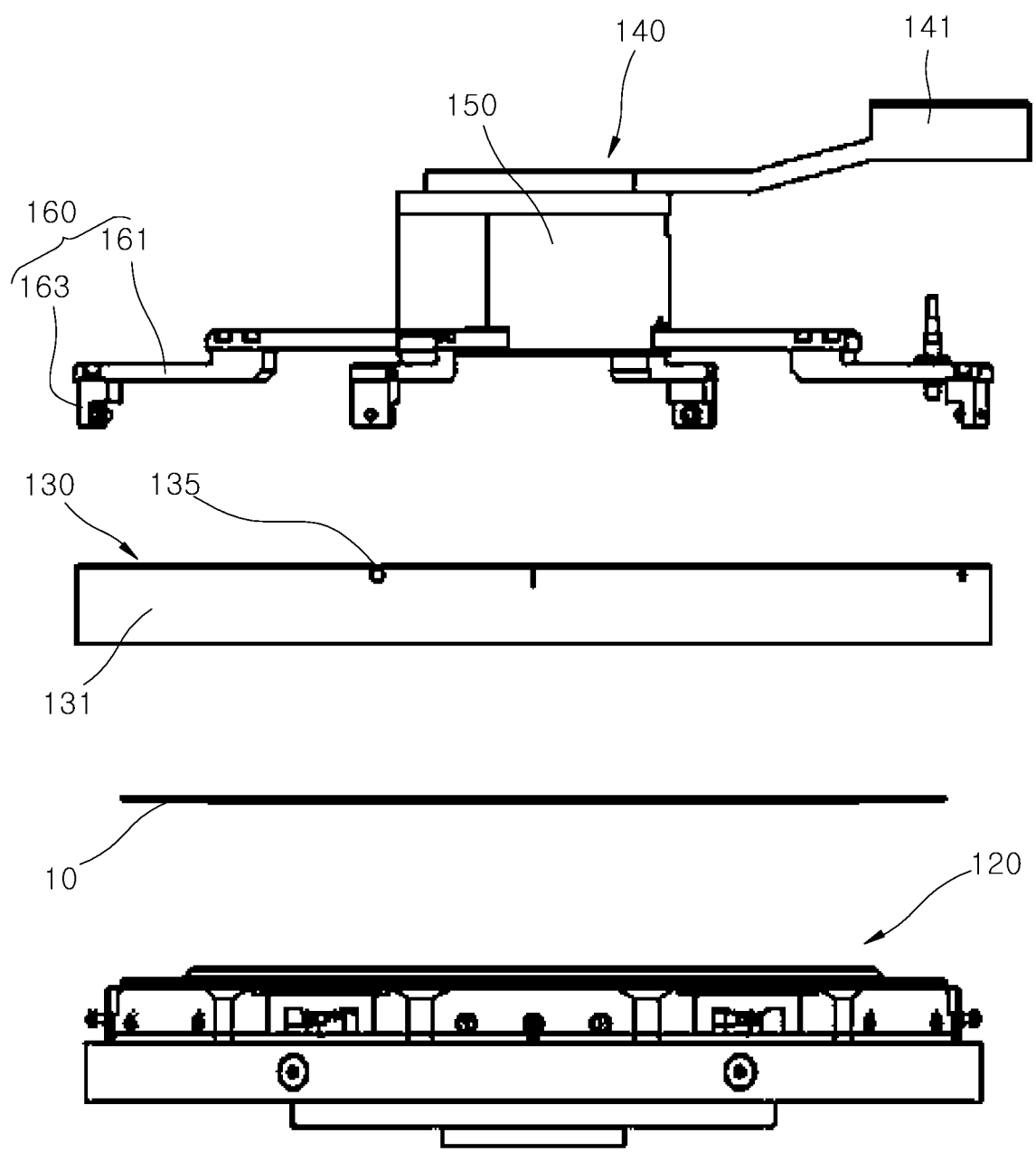
FIG. 9 shows schematic side views illustrating the expander module, the ring cover unit, and the vacuum chuck unit in the wafer processing apparatus according to one embodiment of the present invention.
Figure 10:
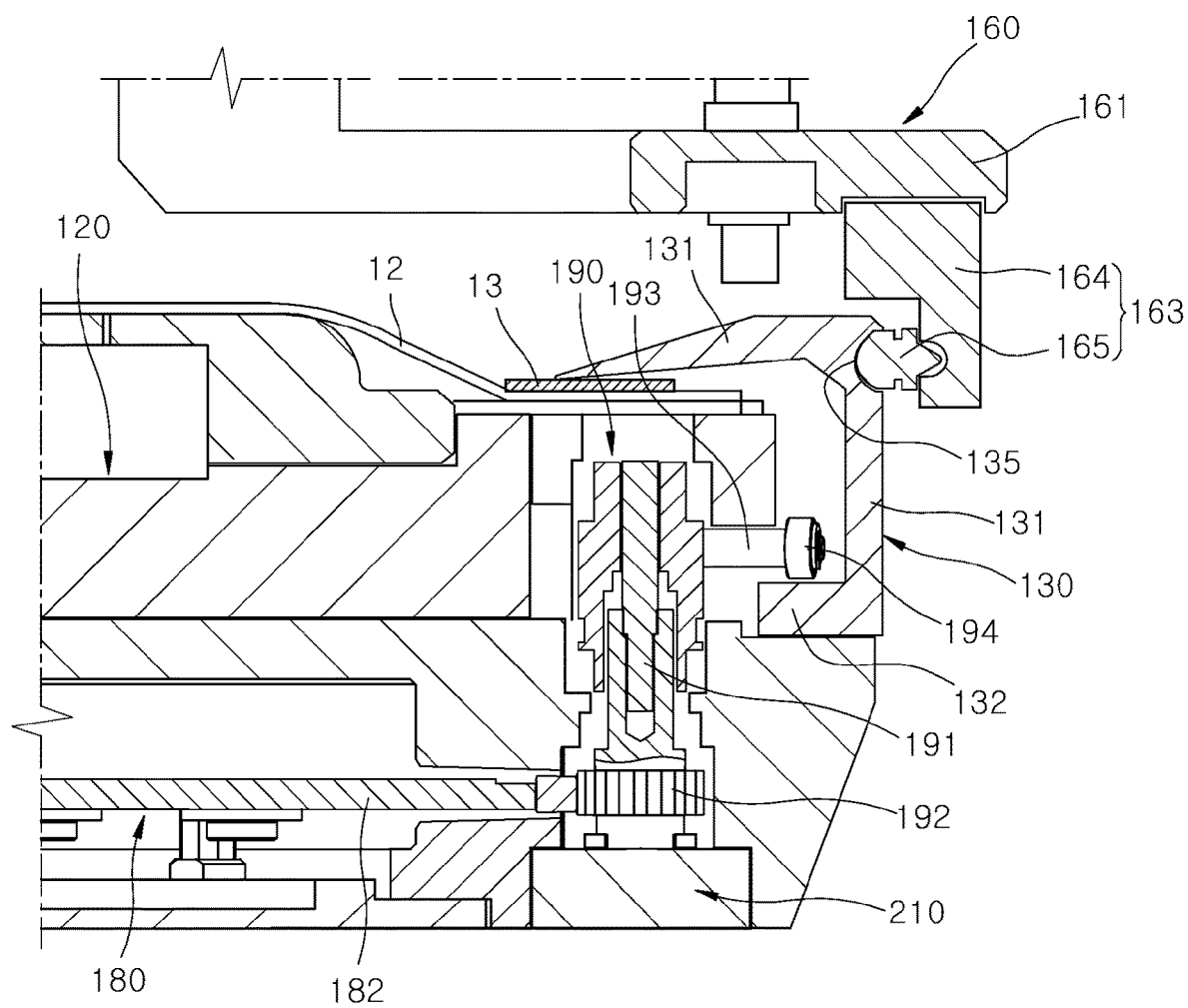
FIG. 10 is a schematic cross-sectional view illustrating a state in which a chucking module restrains the ring cover unit in the wafer processing apparatus according to one embodiment of the present invention.
Figure 11:
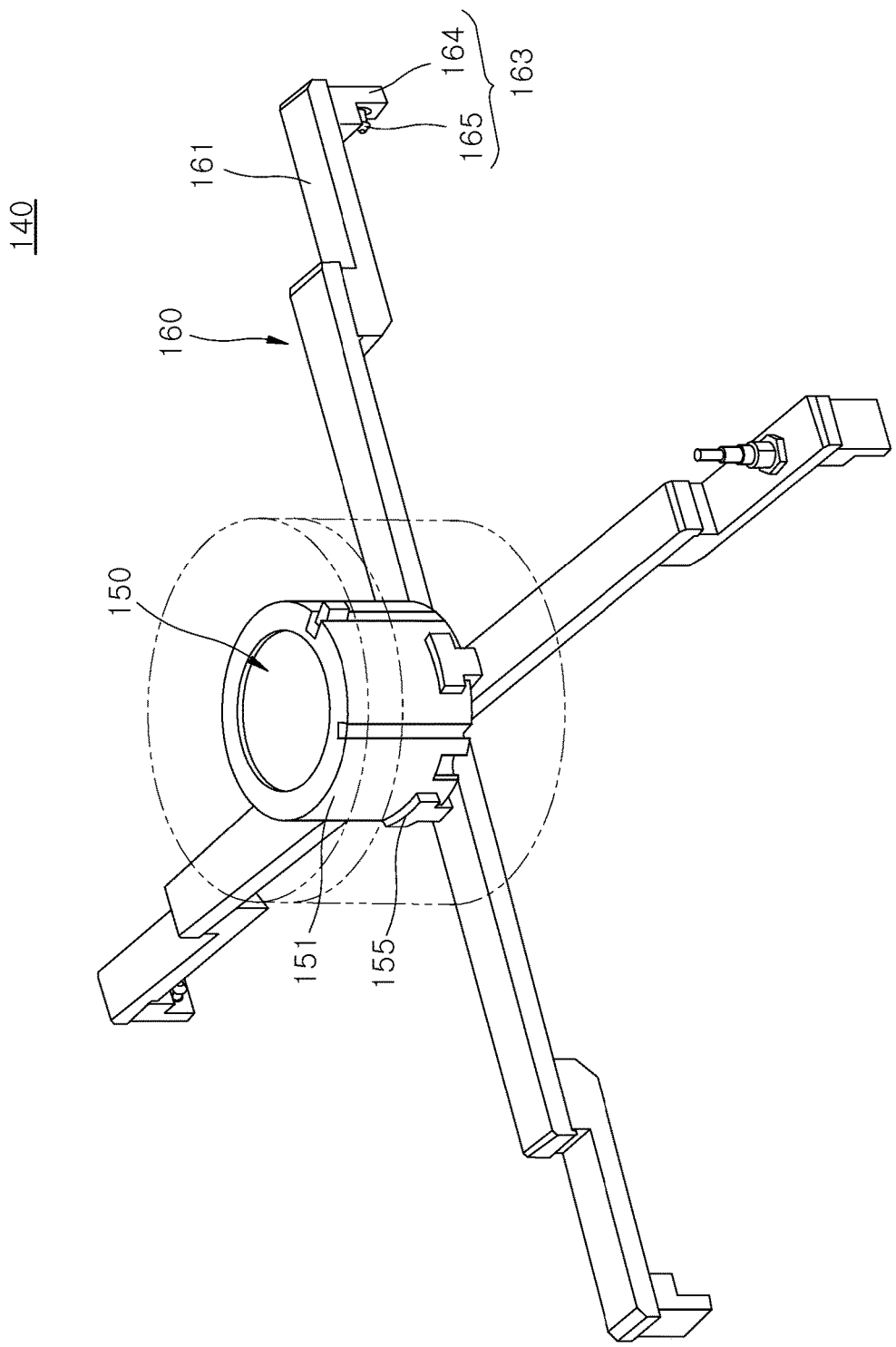
FIG. 11 is a schematic perspective view illustrating the expander module in the wafer processing apparatus according to one embodiment of the present invention.
Figure 12:
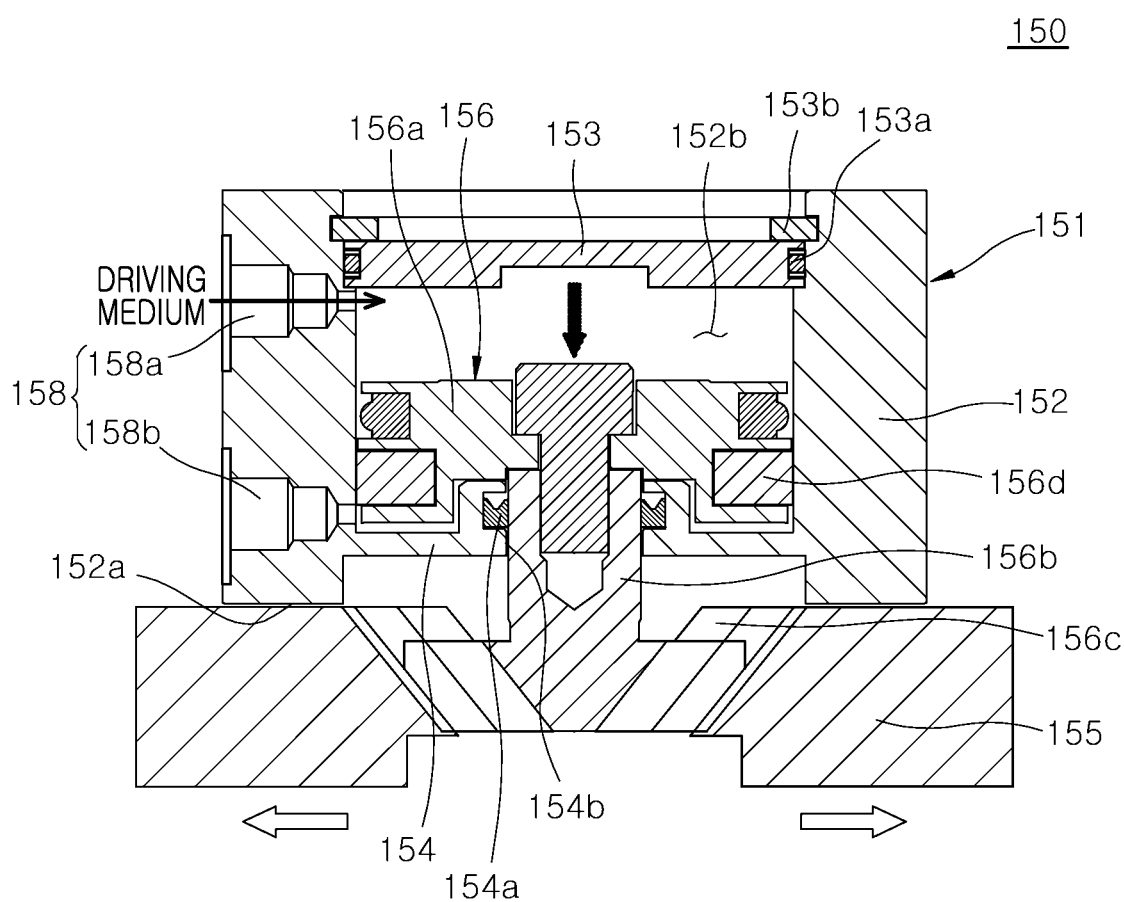
FIG. 12 is a schematic cross-sectional view illustrating an expander head of the expander module in the wafer processing apparatus according to one embodiment of the present invention.
Figure 13:
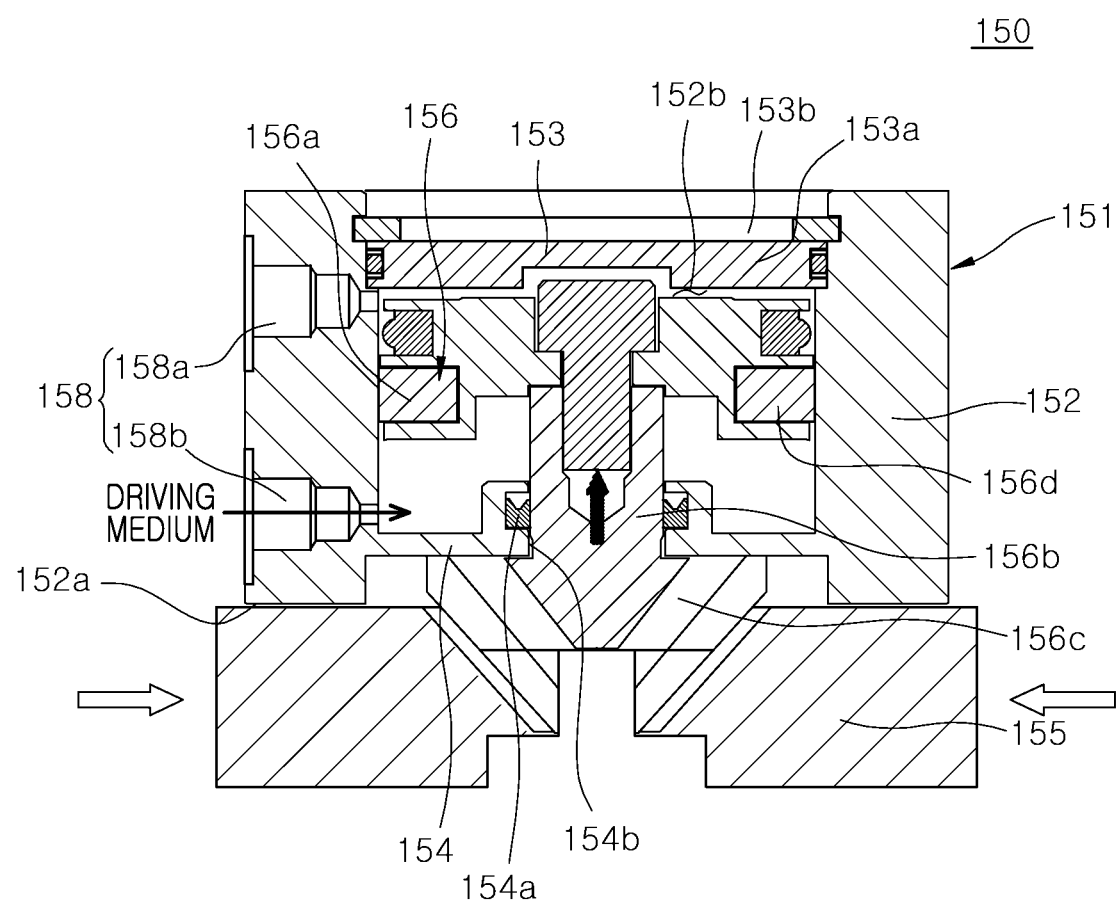
FIG. 13 is a schematic cross-sectional view illustrating a state in which an expander slider moves into the expander head in the expander module of the wafer processing apparatus according to one embodiment of the present invention.

FIGS. 7A and 7B show schematic side views illustrating a state in which the expander module is lowered to press the ring cover unit and the retainer ring portion and widen the gaps between the plurality of first dies in the wafer processing apparatus according to one embodiment of the present invention. FIG. 8 is a schematic perspective view illustrating a state in which the expander module holds and moves the ring cover unit in the wafer processing apparatus according to one embodiment of the present invention. FIG. 9 shows schematic side views illustrating the expander module, the ring cover unit, and the vacuum chuck unit in the wafer processing apparatus according to one embodiment of the present invention. FIG. 10 is a schematic cross-sectional view illustrating a state in which the chucking module restrains the ring cover unit in the wafer processing apparatus according to one embodiment of the present invention. FIG. 11 is a schematic perspective view illustrating the expander module in the wafer processing apparatus according to one embodiment of the present invention. FIG. 12 is a schematic cross-sectional view illustrating an expander head of the expander module in the wafer processing apparatus according to one embodiment of the present invention. FIG. 13 is a schematic cross-sectional view illustrating a state in which an expander slider moves into the expander head in the expander module of the wafer processing apparatus according to one embodiment of the present invention.

Referring to FIGS. 7A to 13, the expander module 140 includes an expander moving part 141, an expander head 150, and a plurality of expander arms 160.

The expander moving part 141 is installed at an upper side of the first vacuum chuck unit 120 to be vertically movable. As long as the expander moving part 141 is installed to be vertically movable, various forms such as a robot arm form and a ball screw form may be applied. The expander head 150 is installed to be movable by the expander moving part 141. The plurality of expander arms 160 are connected to the expander head 150 to hold and move the ring cover unit 130 and press the ring cover unit 130 such that the chucking module 170 restrains the ring cover unit 130 to the first vacuum chuck unit 120. The plurality of expander arms 160 are disposed radially from the expander head 150. Four or more expander arms 160 may be installed at a circumferential portion of the expander head 150.

In a state in which the plurality of expander arms 160 press the ring cover unit 130, since the chucking module 170 restrains the ring cover unit 130 to the vacuum chuck unit 120, the retainer ring portion 13 of the first wafer part 10 moves downward by the ring cover unit 130. In this case, as the ring cover unit 130 is lowered, the adhesive sheet 12 of the first wafer part 10 is pulled in a radial direction and thus is stretched in the radial direction, and as the adhesive sheet 12 is stretched in the radial direction, gaps G2 between the plurality of dies 11 widen. In a state in which the gaps G2 between the plurality of dies 11 widen, when a cleaning solution is sprayed onto the plurality of dies 11, foreign materials attached to the surfaces of the dies 11 as well as foreign materials positioned in the gaps between the plurality of dies 11 can be easily removed by the cleaning solution. Accordingly, cleaning performance with respect to foreign materials on the first wafer part 10 can be considerably improved. In addition, cleaning performance with respect to the first wafer part 10 is considerably improved, thereby considerably reducing a defect rate of the first wafer part 10.

In addition, when the chucking module 170 restrains the ring cover unit 130 to the vacuum chuck unit 120, the expander arm 160 releases the press applied to the ring cover unit 130. The expander moving part 141 moves the expander head 150 and the expander arm 160 above the vacuum chuck unit 120. Accordingly, when the first ultrasonic cleaning module 220 moves above the first wafer part 10, the first ultrasonic cleaning module 220 can be prevented from colliding with or being interfered with by the expander module 140.

The expander head 150 includes an expander casing 151, a plurality of expander sliders 155, an expander rod 156, and an expander driving part 158.

The expander casing 151 is connected to the expander moving part 141. The entirety of the expander casing 151 may be formed in a cylindrical shape. The plurality of expander sliders 155 are coupled to the expander casing 151 to be radially movable and are each connected to one of the expander arms 160. In this case, slider grooves 152a are radially formed at a circumferential portion of the expander casing 151 such that the expander sliders 155 are movably coupled thereto. The expander rod 156 is disposed inside the expander casing 151 to move the plurality of expander sliders 155. The expander rod 156 is installed inside the expander casing 151 to be vertically movable. The expander driving part 158 is disposed in the expander casing 151 to move the expander rod 156.

When the expander driving part 158 is driven, as the expander rod 156 moves, the expander sliders 155 move radially with respect to the expander casing 151. As the expander slider 155 moves outward from the expander casing 151, the expander arm 160 moves outward to release the restraint of the ring cover unit 130, and as the expander slider 155 moves into the expander casing 151, the expander arm 160 moves inward to restrain the ring cover unit 130.

The expander casing 151 includes a casing body 152, a first blocking plate 153, and a second blocking plate 154.

A movement space 152b is formed in the casing body 152 such that the expander rod 156 moves therein. The movement space 152b may be formed in a cylindrical shape. The first blocking plate 153 is installed to block one side of the casing body 152. The first blocking plate 153 is detachably installed at an upper side of the casing body 152. A first sealing member 153a is installed at a circumferential portion of the first blocking plate 153. A snap ring portion 153b is installed at one side of the first blocking plate 153 to prevent the first blocking plate 153 from being separated from the casing body 152. After the expander rod 156 is inserted into the movement space 152b, the first blocking plate 153 is installed to block one side of the casing body 152. The second blocking plate 154 blocks the other side of the casing body 152, and a movement hole 154b is formed therein such that the expander rod 156 is movably inserted. A second sealing member 154a is installed at a circumferential portion of the movement hole 154b to seal a gap with the expander rod 156. The expander rod 156 is installed to be vertically movable.

The expander rod 156 includes a moving disk portion 156a, a plunger portion 156b, and a push portion 156c.

The moving disk portion 156a is movably installed in the movement space 152b of the expander casing 151. A disk sealing member 156d is installed at a circumferential portion of the moving disk portion 156a to seal a gap between an inner surface of the expander casing 151 and an outer surface of the moving disk portion 156a. The moving disk portion 156a is formed in a disk shape. The plunger portion 156b is connected to the moving disk portion 156a to be inserted into the movement hole 154b. The plunger portion 156b is coupled to a central portion of the moving disk portion 156a. The push portion 156c is connected to the plunger portion 156b and the expander slider 155 to move the expander slider 155 as the plunger portion 156b moves. As the push portion 156c is lowered to press the expander slider 155, the expander slider 155 moves outward, and as the push portion 156c is lifted to release the press applied to the expander slider 155, the expander slider 155 moves inward.

A cone portion (not shown) is formed in the plunger portion 156b, and the push portion 156c radially expands by being pressed by the cone portion. In addition, as the cone portion releases the press applied to the push portion 156c, the push portion 156c is radially contracted by a restoring force. The push portion 156c may formed to have a structure in which a plurality of push pieces (not shown) are connected through a spring (not shown) to be expandable and contractible or may be made of a stretchable or contractible material.

The expander driving part 158 includes a first supply port 158a for supplying a driving medium to one side of the movement space 152b to move the moving disk portion 156a toward the expander slider 155 and a second supply port 158b for supplying a driving medium to the other side of the movement space 152b to move the moving disk portion 156a in a direction opposite to the expander slider 155. A first supply line is connected to the first supply port 158a, and a second supply line is connected to the second supply port 158b. When the first supply port 158a supplies the driving medium to one side of the movement space 152b, the second supply port 158b discharges the driving medium from the other side of the movement space 152b, and when the second supply port 158b supplies the driving medium to the other side of the movement space 152b, the first supply port 158a discharges the driving medium from one side of the movement space 152b. Accordingly, when the driving medium is supplied to the first supply port 158a or the second supply port 158b, since the moving disk portion 56a moves to one side or the other side of the movement space 152b, the expander arm 160 may move radially with respect to the casing body 152.

The expander arm 160 includes an arm member 161 connected to the expander slider 155 and a catch portion 163 disposed at the arm member 161 to restrain the ring cover unit 130. The arm members 161 are disposed radially from the casing body 152. The catch portion 163 is disposed at an end portion of the arm member 161. When the expander slider 155 moves into the casing body 152, the catch portion 163 restrains the ring cover unit 130.

The catch portion 163 includes a catch body 164 connected to the arm member 161 to surround an outer side of the ring cover unit 130 and a catch pin 165 coupled to the catch body 164 to be inserted into a cover hole 135 of the ring cover unit 130. The catch body 164 may be formed in an approximately "]" shape to be in contact with an outer corner of the ring cover unit 130. The catch pin 165 is formed to protrude inward toward the catch body 164. As the arm member 161 moves inward by the expander slider 155, since the catch pin 165 is inserted into the cover hole 135 of the ring cover unit 130, the ring cover unit 130 can be prevented from being separated from the expander module 140 when the expander module 140 moves.

Figure 14:
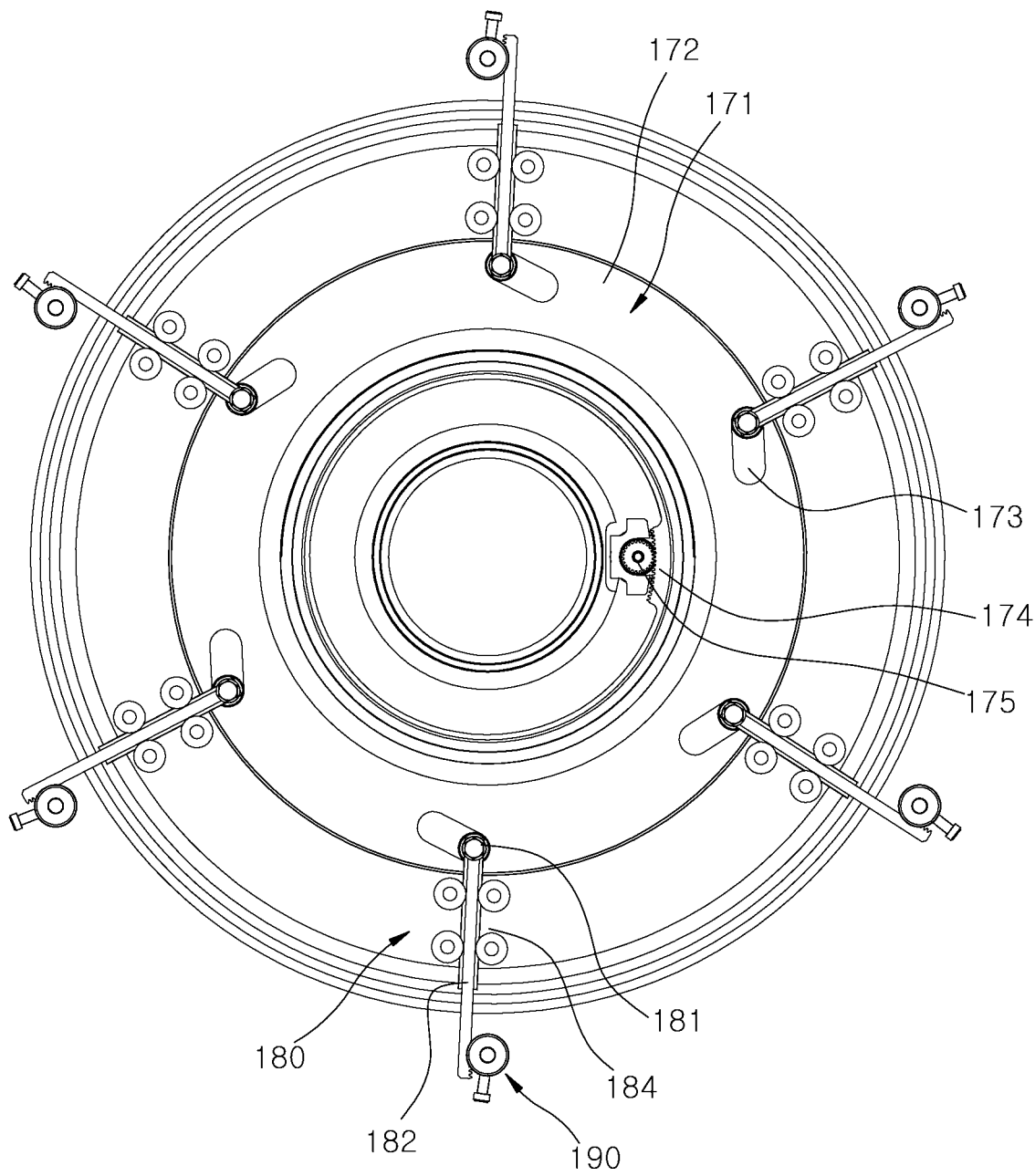
FIG. 14 is a schematic plan view illustrating the chucking module in the wafer processing apparatus according to one embodiment of the present invention.
Figure 15:
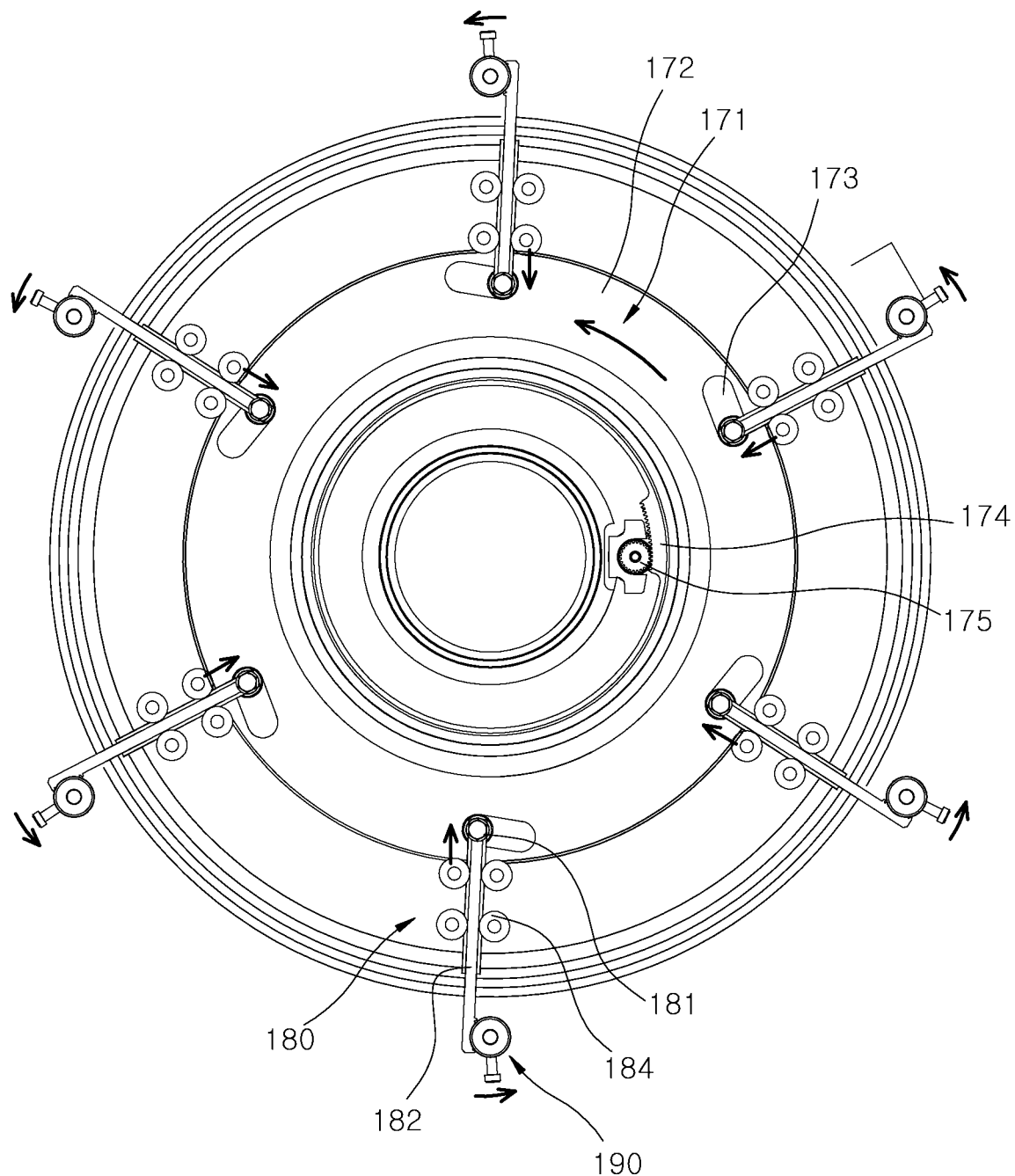
FIG. 15 is a schematic plan view illustrating a state in which, as a chucking base of the chucking module is rotated, a chucking link part is driven in the wafer processing apparatus according to one embodiment of the present invention.
Figure 16:
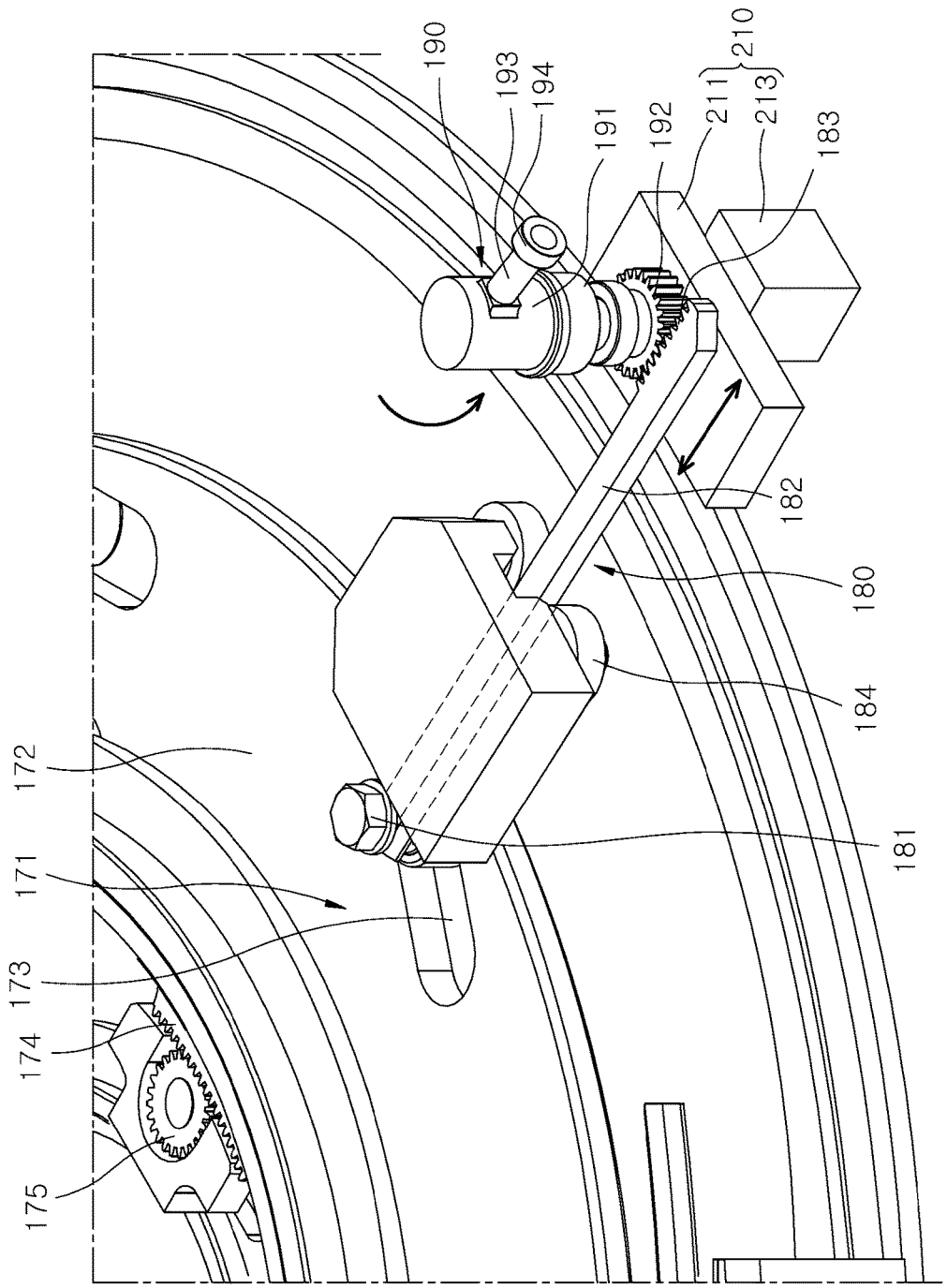
FIG. 16 is a schematic perspective view illustrating a state in which a cover restraining part of the chucking module is driven to restrain the ring cover unit in the wafer processing apparatus according to one embodiment of the present invention.

FIG. 14 is a schematic plan view illustrating the chucking module in the wafer processing apparatus according to one embodiment of the present invention. FIG. 15 is a schematic plan view illustrating a state in which, as a chucking base of the chucking module is rotated, a chucking link part is driven in the wafer processing apparatus according to one embodiment of the present invention. FIG. 16 is a schematic perspective view illustrating a state in which a cover restraining part of the chucking module is driven to restrain the ring cover unit in the wafer processing apparatus according to one embodiment of the present invention.

Referring to FIGS. 14 to 16, the chucking module 170 includes a chucking base 171, a chucking rotating part 175, a plurality of chucking link parts 180, and a plurality of cover restraining parts 190.

The chucking base 171 is installed in the first vacuum chuck unit 120. The chucking rotating part 175 is connected to the chucking base 171 to rotate the chucking base 171. The plurality of chucking link parts 180 are radially connected to the chucking base 171 and move when the chucking base 171 rotates. The plurality of cover restraining parts 190 are each connected to one of the chucking link parts 180 to fix the ring cover unit 130 to the vacuum chuck unit 120 when the chucking link parts 180 move.

As the chucking rotating part 175 is driven, a base gear portion 174 is rotated, and as a base body 172 is rotated together with the base gear portion 174, the chucking link part 180 moves in a radial direction of the base body 172. In this case, when the base body 172 of the chucking base 171 rotates, the plurality of chucking link parts 180 simultaneously move, and as the chucking link parts 180 move, the ring cover unit 130 is fixed to the vacuum chuck unit 120. Therefore, since the first wafer part 10 and the ring cover unit 130 are simultaneously fixed to the vacuum chuck unit 120 using one chucking base 171 and one chucking rotating part 175, the structure of the wafer processing apparatus 100 can be implemented more simply.

The chucking base 171 includes the base body 172, a plurality of guide portions 173, and the base gear portion 174.

The base body 172 is formed in an annular shape to be concentric with the rotating shaft 111 of the first vacuum chuck unit 120. The base body 172 is disposed inside the first vacuum chuck unit 120. The plurality of guide portions 173 are formed in the base body 172 such that the chucking link parts 180 are movably coupled thereto. The number of the plurality of guide portions 173 is the same as the number of the chucking link parts 180, and the plurality of guide portions 173 are formed at equal intervals in a circumferential direction of the base body 172. The base gear portion 174 is formed on the base body 172 and is connected to the chucking rotating part 175. The base gear portion 174 is disposed in a circular arc shape on an inner circumferential surface of the base body 172. As the chucking rotating part 175 is driven, the base gear portion 174 is rotated, and as the base body 172 is rotated together with the base gear portion 174, the chucking link part 180 moves in the radial direction of the base body 172.

The guide portion 173 is formed to be inclined with respect to the radial direction of the base body 172. The guide portion 173 may be a guide hole. The guide portion 173 may be a guide groove or a guide protrusion. Since the guide portion 173 is formed to be inclined with respect to the radial direction of the base body 172, as the base body 172 is rotated at a certain angle, the chucking link part 180 moves linearly in the radial direction of the base body 172.

The chucking link part 180 includes a guide slider 181, a link member 182, and a link gear portion 183.

The guide slider 181 is movably coupled to the guide portion 173. The link member 182 is connected to the guide slider 181 and moves linearly in the radial direction of the base body 172 when the guide slider 181 moves. The link gear portion 183 is formed on the link member 182 to move by being engaged with the cover restraining part 190. The link member 182 is formed in a straight bar shape. The link gear portion 183 is formed in the form of a rack gear parallel to a length direction of the link member 182.

The chucking link part 180 further includes guide rollers 184 for supporting both sides of the link member 182. The guide roller 184 prevents the chucking link part 180 from rotating in the circumferential direction of the base body 172 when the base body 172 is rotated. Accordingly, when the guide slider 181 moves along the guide roller 184 when the base body 172 rotates, the link member 182 may move lineally without rotating.

The cover restraining part 190 includes a cover restraining shaft portion 191 which is rotatably installed in the first vacuum chuck unit 120, a restraining gear portion 192 formed on the cover restraining shaft portion 191 to be engaged with the link gear portion 183, a cover restraining bar 193 connected to the cover restraining shaft portion 191 to press and release the ring cover unit 130, and a restraining roller 194 rotatably installed on the cover restraining bar 193 to be in rolling contact with the ring cover unit 130.

As the link member 182 linearly moves, the link gear portion 183 and the restraining gear portion 192 are driven by being engaged with each other. As the restraining gear portion 192 is rotated, the cover restraining shaft portion 191 and the cover restraining bar 193 are rotated, and the restraining roller 194 moves in rolling contact with the restraining stepped portion 132 of the ring cover unit 130. Therefore, since the restraining roller 194 is in rolling contact with the restraining stepped portion 132 of the ring cover unit 130, foreign materials can be prevented from being generated due to a scratch or abrasion of the restraining stepped portion 132 of the ring cover unit 130. Accordingly, foreign materials are suppressed from being introduced into the first wafer part 10 positioned inside the ring cover unit 130, thereby reducing a defect rate of the first wafer part 10.

The wafer processing apparatus 100 further includes a height adjustment module 210 installed in the first vacuum chuck unit 120 to adjust an installation height of the cover restraining part 190. Before a cleaning process is started, the height adjustment module 210 is operated to adjust the installation height of the cover restraining part 190.

When the installation height of the cover restraining part 190 is adjusted by a height adjustment part 213, a height between an upper surface of the ring cover unit 130 and an upper surface of the first vacuum chuck unit 120 is adjusted. As the installation height of the cover restraining part 190 is adjusted, a height of the restraining roller 194 of the cover restraining part 190 is adjusted. In this case, in a state in which the ring cover unit 130 presses the retainer ring portion 13, when the ring cover unit 130 is restrained by the cover restraining part 190, a degree of stretching of the adhesive sheet 12 of the first wafer part 10 is adjusted according to a restrained height of the retainer ring portion 13. For example, as the installation height of the cover restraining part 190 is decreased, the adhesive sheet 12 is more stretched, and as the installation height of the cover restraining part 190 is increased, the adhesive sheet 12 is less stretched. As the degree of stretching of the adhesive sheet 12 is adjusted, the gaps between the plurality of dies 11 may be adjusted The height adjustment module 210 includes an adjustment member 211 on which the cover restraining part 190 is installed and which is movably coupled to the circumferential portion of the first vacuum chuck unit 120 and the height adjustment part 213 which is connected to the adjustment member 211 to adjust an installation height of the adjustment member 211. The adjustment member 211 may be formed in a block shape that is disposed at the circumferential portion of the first vacuum chuck unit 120 to be vertically movable. As the height adjustment part 213, various forms such as a cylinder or a ball screw for adjusting a height of the adjustment member 211 may be applied.

The height adjustment module 210 may adjust a height of the cover restraining part 190 such that a height difference between the upper surface of the first vacuum chuck unit 120 and the upper surface of the retainer ring portion 13 is formed in a range of approximately 5 mm to 15 mm. The installation height of the cover restraining part 190 may be appropriately adjusted in consideration of the size of the first wafer part 10 and the cleaning speed of the first wafer part 10.

Figure 17:
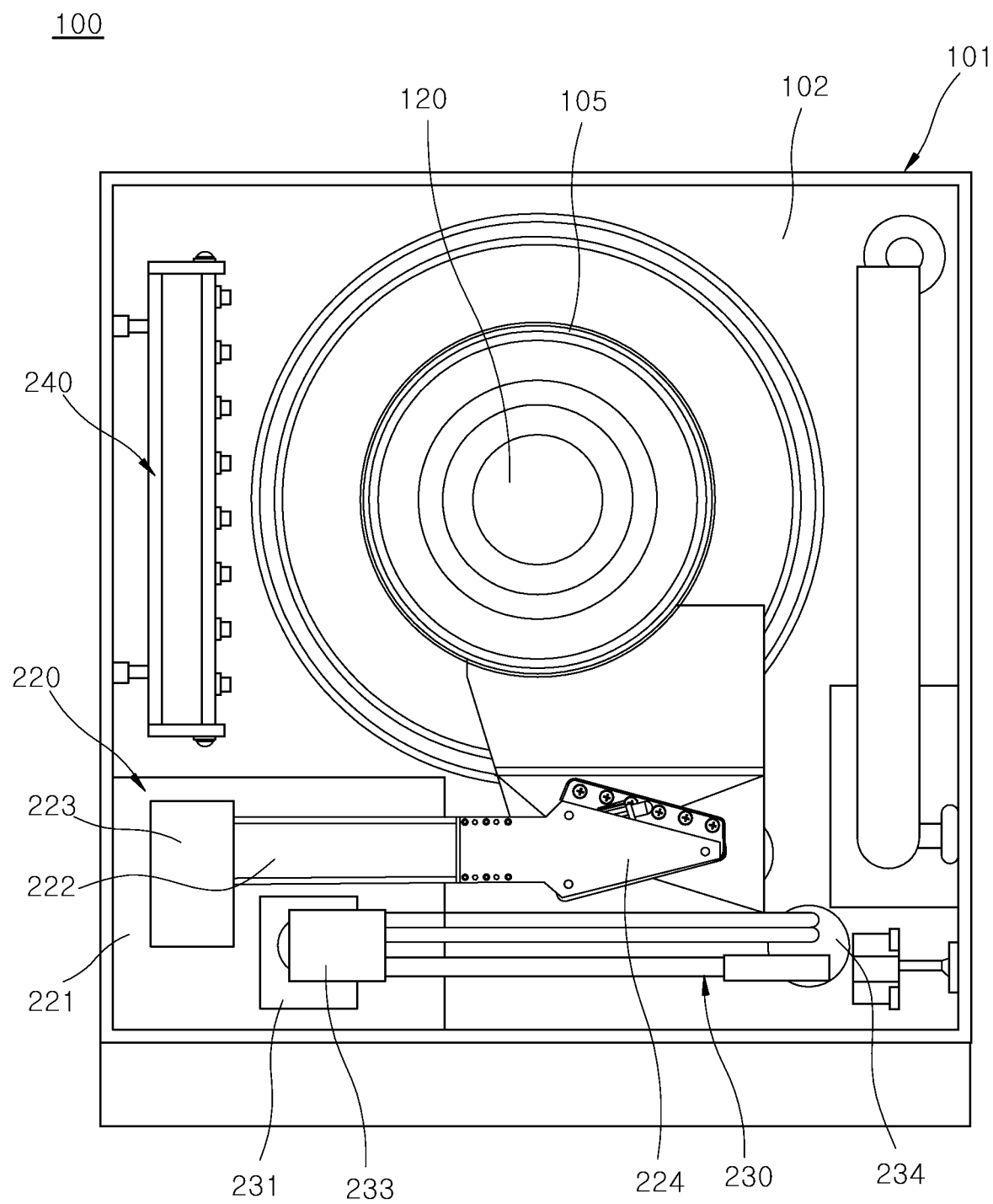
FIG. 17 is a schematic plan view illustrating a state in which a first ultrasonic cleaning module and a cleaning solution spray module are disposed outside the vacuum chuck unit in the wafer processing apparatus according to one embodiment of the present invention.
Figure 18:
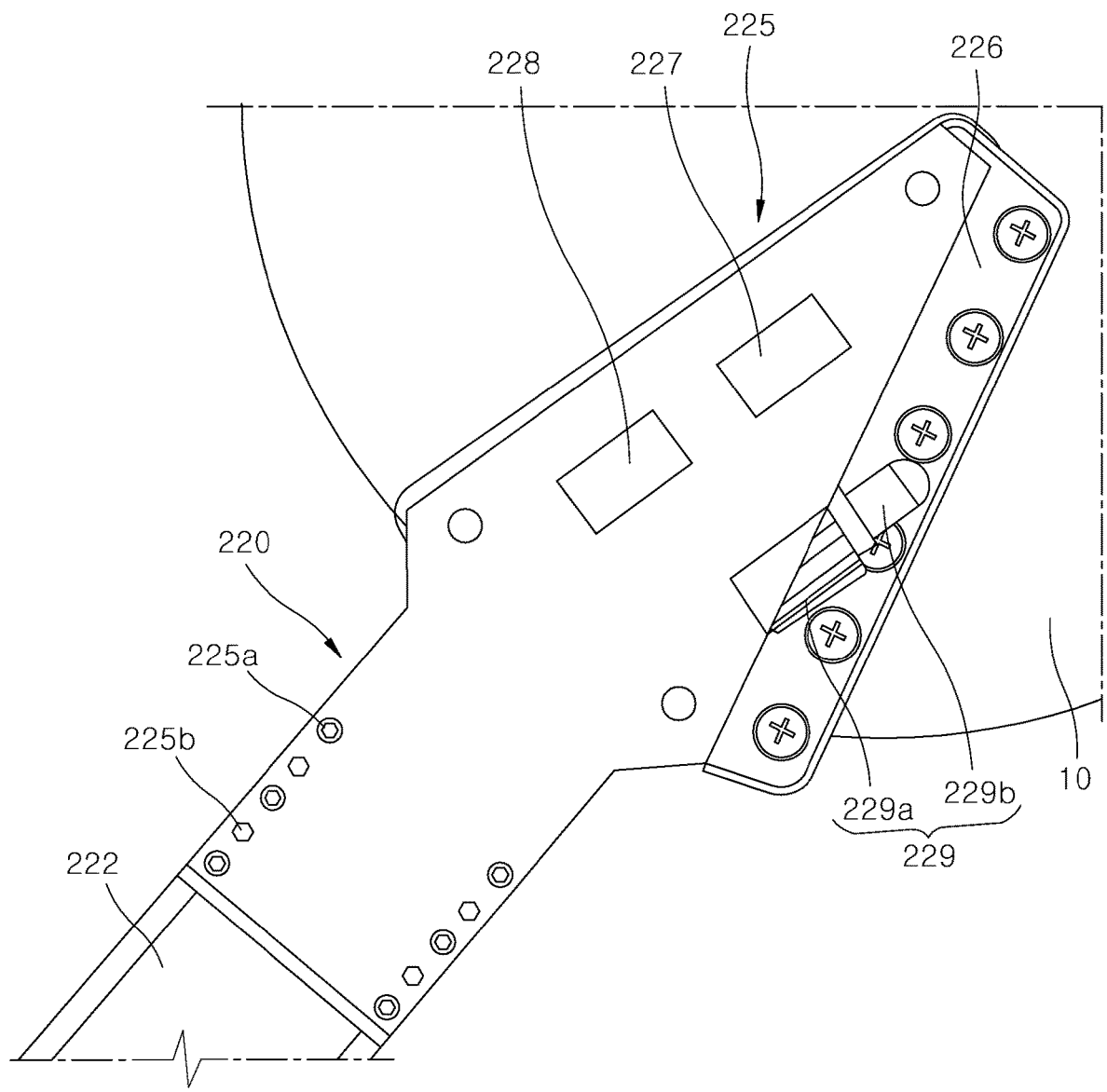
FIG. 18 is a schematic plan view illustrating the first ultrasonic cleaning module in the wafer processing apparatus according to one embodiment of the present invention.
Figure 19:
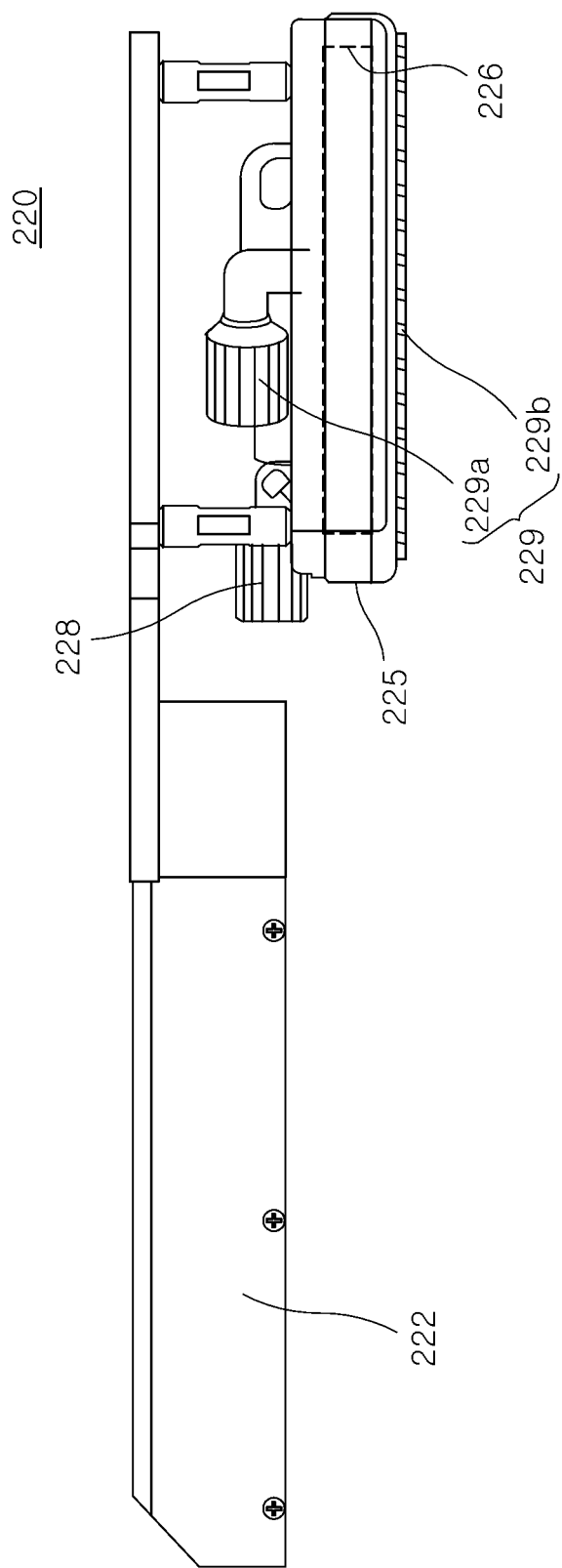
FIG. 19 is a schematic side view illustrating the first ultrasonic cleaning module in the wafer processing apparatus according to one embodiment of the present invention.
Figure 20:
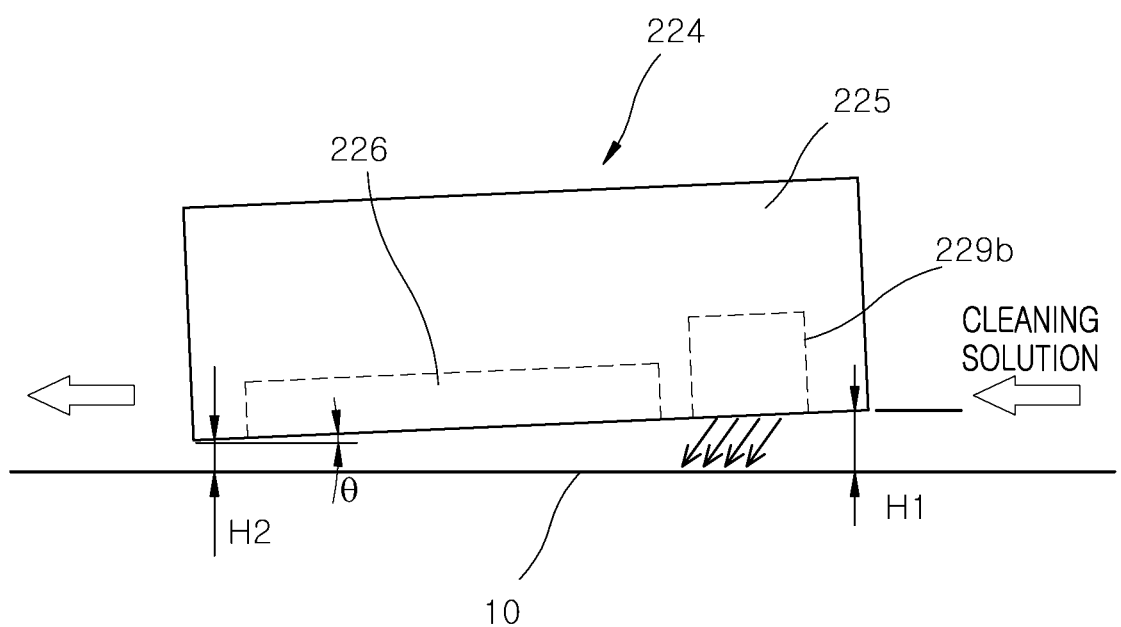
FIG. 20 is a schematic side view illustrating a state in which a cleaning head of the first ultrasonic cleaning module is disposed to be inclined with respect to the first wafer part in the wafer processing apparatus according to one embodiment of the present invention.
Figure 21:
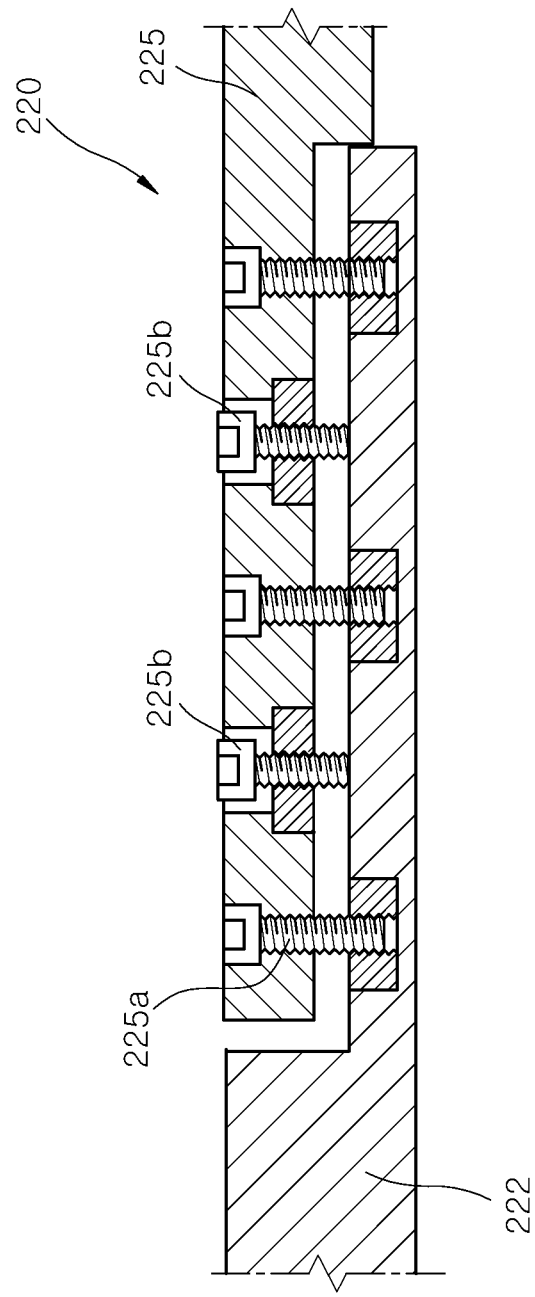
FIG. 21 is a schematic cross-sectional view illustrating coupling bolts and angle adjustment bolts of the cleaning head in the wafer processing apparatus according to one embodiment of the present invention.
Figure 22:
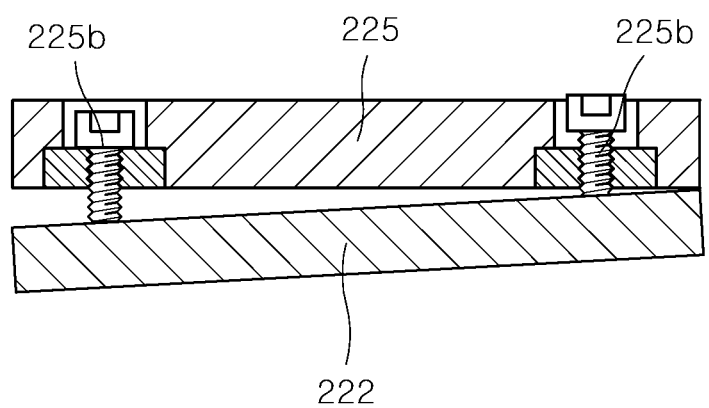
FIG. 22 is a schematic cross-sectional view illustrating a state in which the angle adjustment bolts are installed in the wafer processing apparatus according to one embodiment of the present invention.

FIG. 17 is a schematic plan view illustrating a state in which the first ultrasonic cleaning module and a cleaning solution spray module are disposed outside the vacuum chuck unit in the wafer processing apparatus according to one embodiment of the present invention. FIG. 18 is a schematic plan view illustrating the first ultrasonic cleaning module in the wafer processing apparatus according to one embodiment of the present invention. FIG. 19 is a schematic side view illustrating the first ultrasonic cleaning module in the wafer processing apparatus according to one embodiment of the present invention. FIG. 20 is a schematic side view illustrating a state in which a cleaning head of the first ultrasonic cleaning module is disposed to be inclined with respect to the first wafer part in the wafer processing apparatus according to one embodiment of the present invention. FIG. 21 is a schematic cross-sectional view illustrating coupling bolts and angle adjustment bolts of the cleaning head in the wafer processing apparatus according to one embodiment of the present invention. FIG. 22 is a schematic cross-sectional view illustrating a state in which the angle adjustment bolts are installed in the wafer processing apparatus according to one embodiment of the present invention.

Referring to FIGS. 17 to 22, the wafer processing apparatus 100 further includes the ultrasonic cleaning module 220 which sprays a cleaning solution onto the first wafer part 10 and applies ultrasonic waves to the cleaning solution to ultrasonically vibrate the cleaning solution. In this case, since the first wafer part 10 is cleaned by a chemical action of the cleaning solution and is physically cleaned by a cavitation phenomenon of ultrasonic waves, the cleaning efficiency of the first wafer part 10 can be considerably improved.

The ultrasonic cleaning module 220 applies ultrasonic waves to the cleaning solution in a state of being immersed in the cleaning solution. Accordingly, the cavitation phenomenon may actively proceed under the ultrasonic cleaning module 220.

The ultrasonic cleaning module 220 includes a lifting arm driving part 221, a lifting arm 222, a swing part 223, and an ultrasonic cleaning part 224.

As the lifting arm driving part 221, a motor, a cylinder, or a ball screw is provided. The lifting arm 222 is connected to the lifting arm driving part 221 to be vertically moved by the lifting arm driving part 221. The swing part 223 is connected to the lifting arm 222 to rotate the lifting arm 222. The ultrasonic cleaning part 224 is connected to the lifting arm 222, sprays the cleaning solution onto the first wafer part 10, and applies ultrasonic waves to the cleaning solution. While the first wafer part 10 is mounted on the first vacuum chuck unit 120, the swing part 223 is disposed outside the first vacuum chuck unit 120, and after the first wafer part 10 is mounted on the first vacuum chuck unit 120, the swing part 223 moves above the vacuum chuck unit 120.

The ultrasonic cleaning part 224 includes a cleaning head 225, an ultrasonic wave generator 226, a voltage applying part 227, an internal pressure forming part 228, and a cleaning solution spray part 229. The ultrasonic cleaning part 224 is disposed outside the cup housing 105.

The cleaning head 225 is connected to the lifting arm 222. The ultrasonic wave generator 226 is disposed inside the cleaning head 225 to apply ultrasonic waves to the cleaning solution. The voltage applying part 227 is disposed inside the cleaning head 225 to apply a voltage to the ultrasonic wave generator 226. An electric wire (not shown) is connected to the voltage applying part 227. The internal pressure forming part 228 is installed in the cleaning head 225 to form pressure higher than atmospheric pressure inside the cleaning head 225. The cleaning solution spray part 229 is formed in the cleaning head 225 to spray the cleaning solution onto the first wafer part 10. When the voltage applying part 227 applies a voltage to the ultrasonic wave generator 226, the ultrasonic wave generator 226 generates ultrasonic waves to ultrasonically vibrate the cleaning solution. In this case, since the internal pressure forming part 228 forms pressure higher than atmospheric pressure inside the cleaning head 225, the cleaning solution can be prevented from flowing into the cleaning head 225. Accordingly, the voltage applying part 227 and the ultrasonic wave generator 226 can be prevented from being short-circuited or damaged by the cleaning solution.

The cleaning solution spray part 229 includes a cleaning solution inlet portion 229a into which the cleaning solution flows and a plurality of spray nozzles 229b for spraying the cleaning solution discharged from the cleaning solution inlet portion 229a onto the first wafer part 10. The plurality of spray nozzles 229b may be formed in a row or a plurality of rows at a lower side of the cleaning head 225. The spray nozzles 229b are arranged in a radial direction of the first wafer part 10. Since the plurality of spray nozzles 229b spray the cleaning solution onto the first wafer part 10, the first wafer part 10 may be cleaned by spray pressure of the cleaning solution. In addition, since the plurality of spray nozzles 229b are arranged in the radial direction of the first wafer part 10, when the first wafer part 10 is rotated by the first vacuum chuck unit 120, the cleaning solution may be sprayed onto the first wafer part 10 in a state in which the cleaning head 225 is positioned and fixed.

The plurality of spray nozzles 229b spray the cleaning solution to be inclined at a certain angle with respect to a direction in which the cleaning solution flows on the first wafer part 10. For example, when the first wafer part 10 is rotated clockwise, the plurality of spray nozzles 229b spray the cleaning solution to be inclined clockwise with respect to the cleaning head 225. In addition, when the first wafer part 10 is rotated counterclockwise, the plurality of spray nozzles 229b spray the cleaning solution to be inclined counterclockwise with respect to the cleaning head 225. Accordingly, since the cleaning solution is guided to smoothly pass the lower side of the cleaning head 225, the stagnation of the cleaning solution can be prevented, and the fluidity of the cleaning solution can be secured.

An inflow side of a lower surface of the cleaning head 225 into which the cleaning solution flows is at a higher level than an outflow side thereof of which the cleaning solution flows out (H1>H2). Accordingly, the cleaning solution can be prevented from stagnating by colliding with a corner of the inlet side of the cleaning head 225. In addition, after the cleaning solution smoothly flows onto the lower surface of the cleaning head 225, the cleaning solution may more rapidly pass the lower surface of the cleaning head 225. That is, a supply solution smoothly flows into the lower side of the cleaning head 225 by a rotational force of the first vacuum chuck unit 120, and the supply solution is minimized from colliding with the cleaning head 225, thereby considerably reducing the flow resistance of the supply solution.

The cleaning head 225 further includes a plurality of coupling bolts 225a screw-coupled to the cleaning head 225 and the lifting arm 222 and angle adjustment bolts 225b screw-coupled the cleaning head 225 and the lifting arm 222 to adjust an angle θ of the cleaning head 225. The plurality of coupling bolts 225a and the plurality of angle adjustment bolts 225b are installed at both sides of the cleaning head 225 in a width direction. Since the angle adjustment bolt 225b is coupled to the cleaning head 225 to protrude therefrom, the cleaning head 225 and one side of the lifting arm 222 are slightly spaced apart from each other, and the coupling bolt 225a is coupled to the cleaning head 225 and the lifting arm 222. Accordingly, since the cleaning head 225 is coupled in a state of being slightly skewed with respect to the lifting arm 222, an installation angle of the cleaning head 225 can be adjusted. The installation angle of the cleaning head 225 may be appropriately designed in consideration of the rotation speed of the first wafer part 10, the size of the first wafer part 10, the separation distance of the cleaning head 225, the viscosity of the cleaning solution, and the like The cleaning head 225 is installed such that a height of a lower surface of one side of the cleaning head 225 is adjusted according to a change in height of the first wafer part 10. For example, the height of the lower surface of one side of the cleaning head 225 may be adjusted according to an angle at which the cleaning head 225 is skewed with respect to the lifting arm 222. Accordingly, the height of the lower surface of one side of the cleaning head may be appropriately adjusted such that the cleaning solution flows smoothly onto the lower surface of the cleaning head 225 and then more rapidly passes the lower surface of the cleaning head 225.

The wafer processing apparatus 100 further includes a cleaning solution spray module 230 for spraying the cleaning solution onto the first wafer part 10. The cleaning solution spray module 230 may spray a cleaning solution including DIW and nitrogen gas onto the first wafer part 10.

The cleaning solution spray module 230 includes a turning arm driving part 231, a turning arm 232, a turning part 233, and a spray part 234.

As the turning arm driving part 23, a motor, a cylinder, or a ball screw unit is provided. The turning arm 232 is connected to the turning arm driving part 231 to be vertically moved by the turning arm driving part 231. The turning part 233 is connected to the turning arm 232 to rotate the turning arm 232. The spray part 234 is connected to the turning arm 232 and sprays the cleaning solution onto the first wafer part 10.

The spray part 234 may include one spray nozzle. Since one spray nozzle sprays the cleaning solution onto the first wafer part 10, when the first wafer part 10 is rotated by the first vacuum chuck unit 120, the one spray nozzle sprays the cleaning solution onto the first wafer part 10 when the spray part 234 repeatedly turns in a certain angle range.

The first ultrasonic cleaning module 220 and the cleaning solution spray module 230 may be selectively used according to a processing process of the first wafer part 10.

Figure 23:
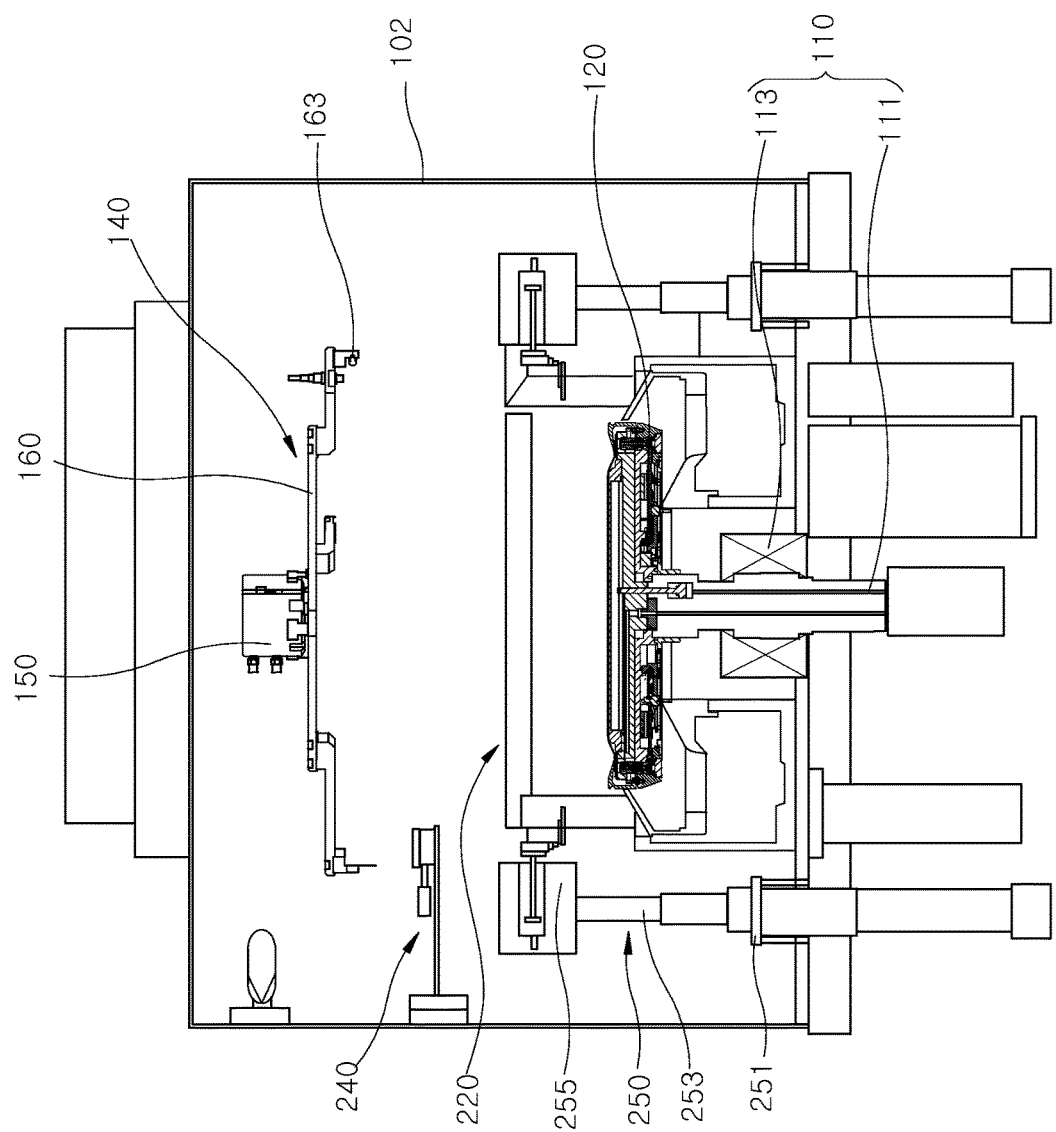
FIG. 23 is a schematic side view illustrating a first ionizer and a transfer unit installed in the first chamber unit of the wafer processing apparatus according to one embodiment of the present invention.

FIG. 23 is a schematic side view illustrating a first ionizer and a transfer unit installed in the first chamber unit of the wafer processing apparatus according to one embodiment of the present invention.

Referring to FIG. 23, a first ionizer 240 is installed inside the first chamber unit. The first ionizer 240 is disposed at an upper side of the first chamber unit 102 and removes static electricity generated during a processing process and a non-processing process of the first wafer part 10. Since the first ionizer 240 prevents static electricity from being generated on the first wafer part 10 and inside the chamber unit, foreign materials can be prevented from being reattached to the first wafer part 10 by static electricity.

When air as a supply gas is supplied to the first ionizer 240 and DIW as a cleaning solution is supplied, positive ions and negative ions ionized through the first ionizer 240, along with the cleaning solution, may be sprayed onto a wafer.

Before DIW including positive ions and negative ions is sprayed onto the first wafer part 10, an electrostatic potential of the first wafer part 10 was measured to be approximately 3.6 KV. On the other hand, after DIW including positive ions and negative ions is sprayed onto the first wafer part 10, the electrostatic potential was measured to be in a range of about −0.10 KV to −0.17 KV. Since the electrostatic potential appears as such a negative voltage, an amount of positive ions generated by the first ionizer 240 is increased, thereby controlling the static electricity of the first wafer part 10 to be close to "zero" which is an ideal value.

A transfer unit 250 is installed in the first chamber unit 102 to receive the first wafer part 10 from a transport unit (not shown). The transfer unit 250 includes a transfer moving part 251 movably installed on a bottom surface of the first chamber unit 102, a transfer lifting part 253 installed on the transfer moving part 251, and a transfer mounting part 255 installed on the transfer lifting part 253.

When the first wafer part 10 transferred from the transport unit is mounted on the transfer mounting part 255, the transfer lifting part 253 is moved to both sides of the first vacuum chuck unit 120 by the transfer moving part. When the transfer lifting part 253 lowers the transfer mounting part 255, the first wafer part 10 is mounted on the first vacuum chuck unit 120. After the first wafer part 10 is mounted on the first vacuum chuck unit 120, the transfer unit 250 returns to the original position thereof to receive the first wafer part 10 from the transport unit.

Figure 24:
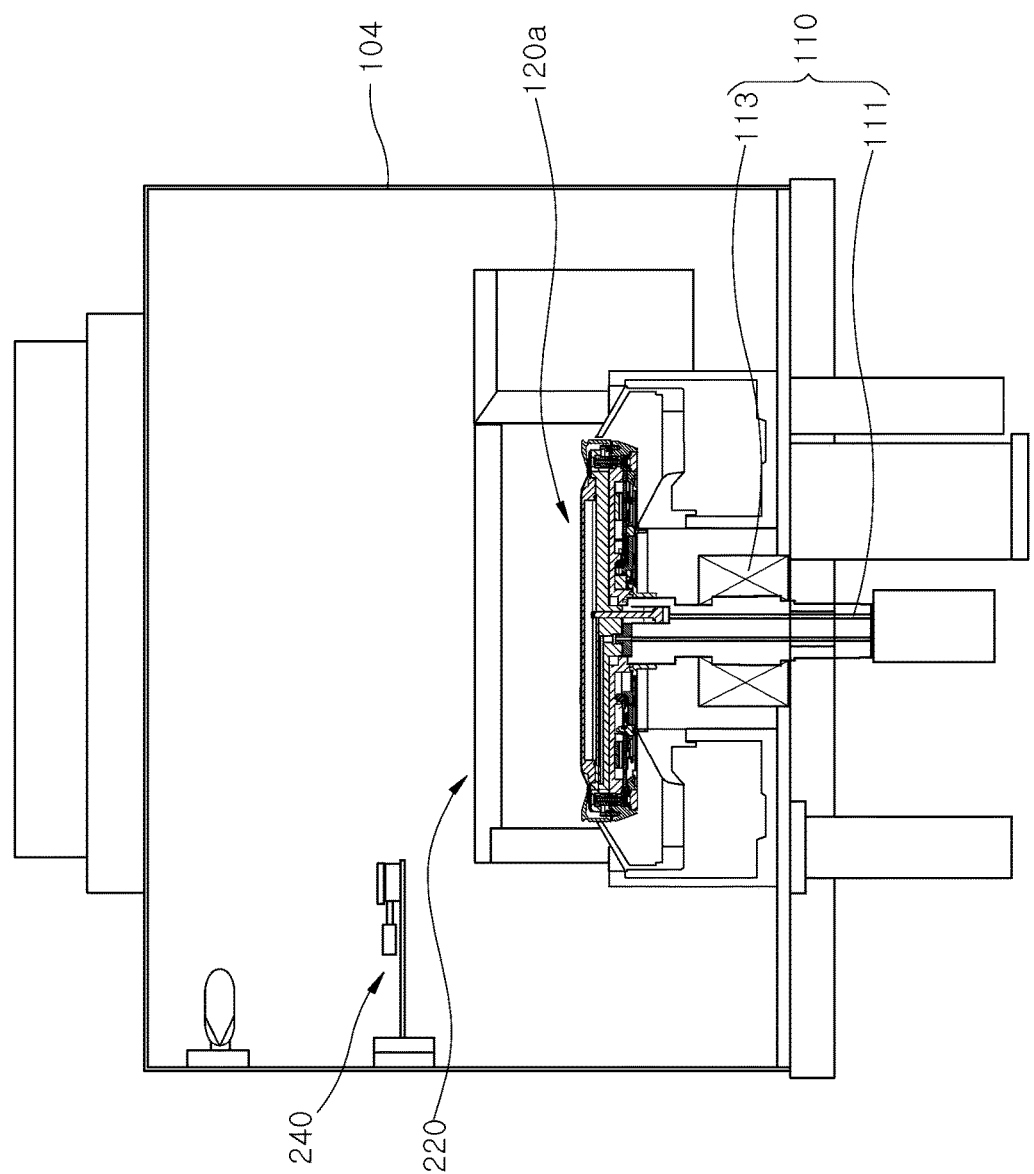
FIG. 24 is a schematic side view illustrating a second vacuum chuck unit and a second ionizer installed in the second chamber unit of the wafer processing apparatus according to one embodiment of the present invention.

FIG. 24 is a schematic side view illustrating a second vacuum chuck unit and a second ionizer installed in the second chamber unit of the wafer processing apparatus according to one embodiment of the present invention.

Referring to FIG. 24, a second vacuum chuck unit 120a is disposed in the second chamber unit 104, and the second wafer part 20 is mounted on the second vacuum chuck unit 120a. The second wafer part 20 is loaded into the second chamber unit 104, and a retainer ring portion 13 is not present in the second wafer part 20. Accordingly, a ring cover unit 130, an expander module 140, and a transfer unit 250 are not installed in the second chamber unit 104. In addition, a chucking module 170 and a height adjustment module 210 are not installed in the second vacuum chuck unit 120a. A vacuum flow path 122 and a vacuum chamber 124 are formed in the second vacuum chuck unit 120a to adsorb the carrier 22 on which the second wafer part 20 is mounted.

A cup housing 105 is installed in the first chamber unit 102. The second vacuum chuck unit 120a is disposed inside the cup housing 105 in which a cleaning solution is accommodated. The cup housing 105 is installed to surround an outer side of the second vacuum chuck unit 120a. The cleaning solution sprayed from the cup housing 105 may be prevented from being discharged or scattered to the outside by the cup housing 105.

The second vacuum chuck unit 120a is installed to be rotatable by a driving unit 110. The entirety of the second vacuum chuck unit 120a may be formed in a disk shape.

The second ultrasonic cleaning module 220 sprays the cleaning solution onto the second wafer part 20 and applies ultrasonic waves to the cleaning solution to ultrasonically vibrate the cleaning solution. Since the second ultrasonic cleaning module 220 is substantially the same as the first ultrasonic cleaning module 220, the same reference number as that of the first ultrasonic cleaning module 220 is given to the second ultrasonic cleaning module 220, and detailed descriptions thereof will be omitted.

A second ionizer 240 disposed in the second vacuum chamber unit 120a is installed. Since the second ionizer 240 is substantially the same as the first ionizer 240, the same reference number as that of the first ionizer 240 is given to the second ionizer 240, and detailed descriptions thereof will be omitted.

A wafer processing apparatus of the wafer processing apparatus according to one embodiment of the present invention configured as described above will be described.

Figure 25:
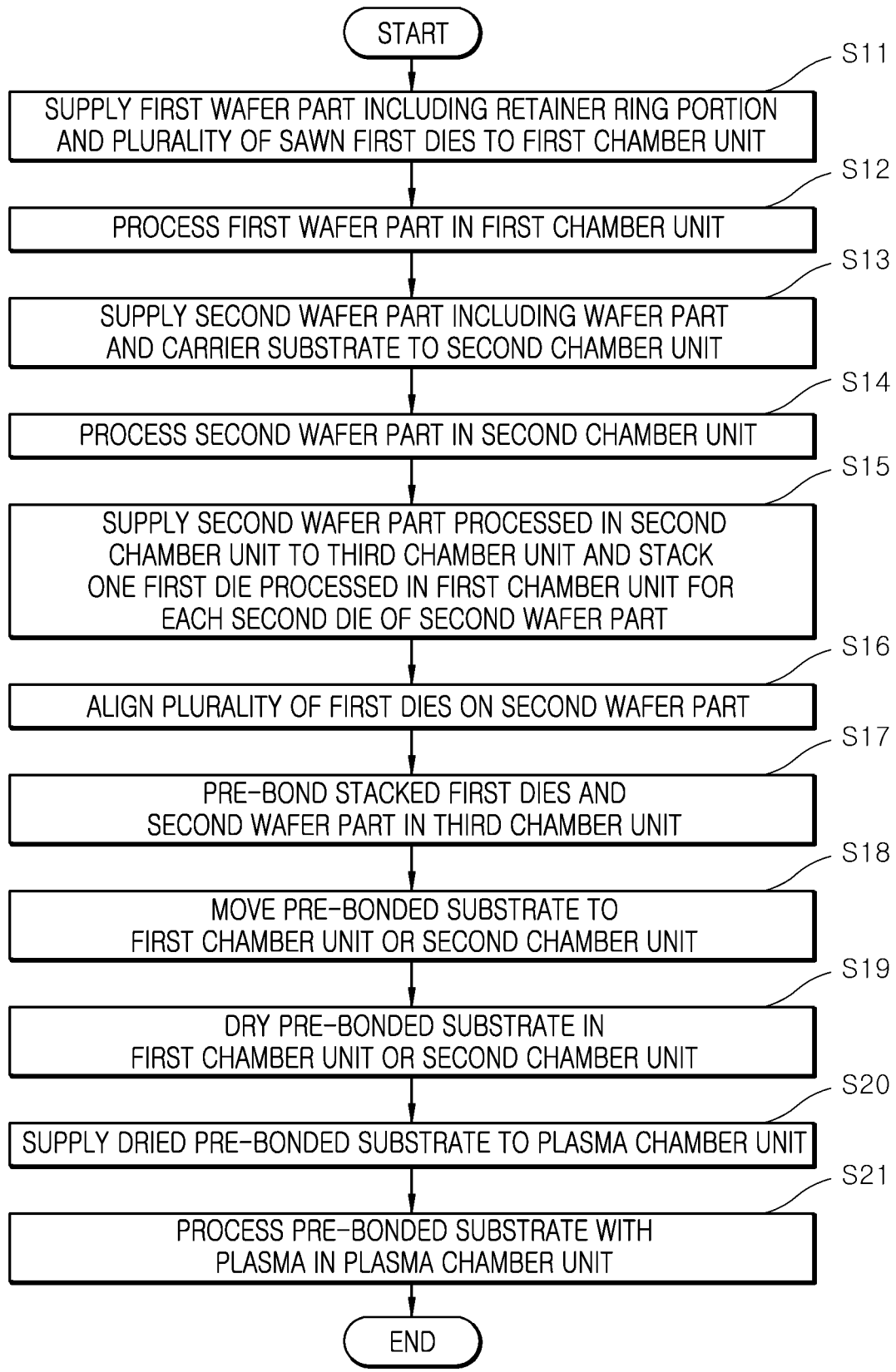
FIG. 25 is a schematic flowchart illustrating a wafer processing method according to one embodiment of the present invention.

FIG. 25 is a schematic flowchart illustrating a wafer processing method according to one embodiment of the present invention.

Referring to FIG. 25, foreign materials may be generated during a process of processing a first wafer part 10 and a second wafer part 20. The foreign materials permeate into a silicon surface to change resistivity or conductivity, thereby having a fatal effect on the electrical characteristics of an integrated circuit.

The first wafer part 10 and the second wafer part 20 move to a plasma chamber unit 400. In the plasma chamber unit 400, the first wafer part 10 and the second wafer part 20 are processed with plasma. The first wafer part 10 and the second wafer part 20 are processed with plasma in the plasma chamber unit 400 to form a protective film on the first wafer part 10 and the second wafer part 20, thereby preventing the permeation of foreign materials.

The first wafer part 10 including a retainer ring portion 13 and a plurality of sawn first dies 11 is supplied to the first chamber unit 102 (S11). In this case, an adhesive sheet 12 is pulled tight by the retainer ring portion 13 so that the plurality of dies 11 are positioned and fixed, and the die 11, which is a thin plate, maintains a flat plate shape.

The first wafer part 10 is processed in the first chamber unit 102 (S12). In this case, in the first chamber unit 102, a first ultrasonic cleaning module 220 sprays a cleaning solution onto the first wafer part 10 and applies ultrasonic waves to the cleaning solution to ultrasonically vibrate the cleaning solution. Therefore, since the first wafer part 10 is cleaned by a chemical action of the cleaning solution and is physically cleaned by a cavitation phenomenon of ultrasonic waves, the cleaning efficiency of the first wafer part 10 can be considerably improved.

An internal pressure forming part 228 of the first ultrasonic cleaning module 220 forms pressure higher than atmospheric pressure inside a cleaning head 225. Since the internal pressure forming part 228 forms pressure higher than atmospheric pressure inside the cleaning head 225, the cleaning solution can be prevented from flowing into the cleaning head 225. Accordingly, a voltage applying part 227 and an ultrasonic wave generator 226 can be prevented from being short-circuited or damaged by the cleaning solution.

An inflow side of a lower surface of the cleaning head 225 into which the cleaning solution flows is formed at a higher level than an outflow side thereof of which the cleaning solution flows out (H1>H2). Accordingly, the cleaning solution can be prevented from stagnating by colliding with a corner of the inlet side of the cleaning head 225. In addition, after the cleaning solution smoothly flows onto the lower surface of the cleaning head 225, the cleaning solution may more rapidly pass the lower surface of the cleaning head 225. That is, a supply solution smoothly flows into a lower side of the cleaning head 225 by a rotational force of the first vacuum chuck unit 120, and the supply solution is minimized from colliding with the cleaning head 225, thereby considerably reducing the flow resistance of the supply solution.

The cleaning head 225 is installed such that a height of a lower surface of one side of the cleaning head 225 is adjusted according to a change in height of the first wafer part 10. For example, the height of the lower surface of one side of the cleaning head 225 may be adjusted according to an angle at which the cleaning head 225 is skewed with respect to a lifting arm 222. Therefore, the height of the lower surface of one side of the cleaning head 225 may be appropriately adjusted such that the cleaning solution smoothly flows onto the lower surface of the cleaning head 225 and then more rapidly passes the lower surface of the cleaning head 225.

In addition, a first ionizer 240 of the first chamber unit 102 sprays DIW including positive ions and negative ions on to the first wafer part 10 to remove static electricity. In this case, the first ionizer 240 removes static electricity generated during a processing process and a non-processing process of the first wafer part 10. Since the first ionizer 240 prevents static electricity from being generated on the first wafer part 10 and inside the first chamber unit 102, foreign materials can be prevented from being reattached to the first wafer part 10 by static electricity Before DIW including positive ions and negative ions is sprayed onto the first wafer part 10, an electrostatic potential of the first wafer part 10 is measured to be approximately 3.6 KV. On the other hand, after DIW including positive ions and negative ions is sprayed onto the first wafer part 10, the electrostatic potential is measured to be in a range of about −0.10 KV to −0.17 KV. Since the electrostatic potential appears as such a negative voltage, an amount of positive ions generated by the first ionizer 240 is increased, thereby controlling the static electricity of the first wafer part 10 to be close to "zero" which is an ideal value.

The second wafer part 20 including a wafer part and a carrier substrate is supplied to a second chamber unit 104 (S13). In the second wafer part 20, a plurality of second dies 21 are not sawn. The second wafer part 20 is supplied to the second chamber unit 104 in a state of being processed with plasma.

The second wafer part 20 is processed in the second chamber unit 104 (S14). In this case, in the second chamber unit 104, a second ultrasonic cleaning module 220 sprays the cleaning solution onto the second wafer part 20 and applies ultrasonic waves to the cleaning solution to ultrasonically vibrate the cleaning solution. Therefore, since the second wafer part 20 is cleaned by a chemical action of the cleaning solution and is physically cleaned by a cavitation phenomenon of ultrasonic waves, the cleaning efficiency of the second wafer part 20 can be considerably improved.

An internal pressure forming part 228 of the second ultrasonic cleaning module 220 forms pressure higher than atmospheric pressure inside a cleaning head 225. Since the internal pressure forming part 228 of the second ultrasonic cleaning module 220 forms pressure higher than atmospheric pressure inside the cleaning head 225, the cleaning solution can be prevented from flowing into the cleaning head 225. Accordingly, a voltage applying part 227 and an ultrasonic wave generator 226 can be prevented from being short-circuited or damaged by the cleaning solution.

In the second ultrasonic cleaning module 220, an inflow side of a lower surface of the cleaning head 225 into which the cleaning solution flows is formed at a higher level than an outflow side thereof of which the cleaning solution flows out (H1>H2). Accordingly, the cleaning solution can be prevented from stagnating by colliding with a corner of the inlet side of the cleaning head 225. In addition, after the cleaning solution smoothly flows onto the lower surface of the cleaning head 225, the cleaning solution may more rapidly pass the lower surface of the cleaning head 225. That is, a supply solution smoothly flows into a lower side of the cleaning head 225 by a rotational force of a second vacuum chuck unit 120a, and the supply solution is minimized from colliding with the cleaning head 225, thereby considerably reducing the flow resistance of the supply solution.

The cleaning head 225 is installed such that a height of a lower surface of one side of the cleaning head 225 is adjusted according to a change in height of the second wafer part 20. For example, the height of the lower surface of one side of the cleaning head 225 may be adjusted according to an angle at which the cleaning head 225 is skewed with respect to a lifting arm 222. Therefore, the height of the lower surface of one side of the cleaning head 225 may be appropriately adjusted such that the cleaning solution smoothly flows onto the lower surface of the cleaning head 225 and then more rapidly passes the lower surface of the cleaning head 225.

A second ionizer 240 of the second chamber unit 104 sprays DIW including positive ions and negative ions onto the second wafer part 20 to remove static electricity. In this case, the second ionizer 240 removes static electricity generated during a processing process and a non-processing process of the second wafer part 20. Since the second ionizer 240 prevents static electricity from being generated on the second wafer part 20 and inside the second chamber unit 104, foreign materials can be prevented from being reattached to the second wafer part 20 by static electricity.

Before DIW including positive ions and negative ions is sprayed onto the second wafer part 20, an electrostatic potential of the second wafer part 20 is measured to be approximately 3.6 KV. On the other hand, after DIW including positive ions and negative ions is sprayed onto the second wafer part 20, the electrostatic potential is measured to be in a range of about −0.10 KV to −0.17 KV. Since the electrostatic potential appears as such a negative voltage, an amount of positive ions generated by the second ionizer 240 is increased, thereby controlling the static electricity of the second wafer part 20 to be close to "zero" which is an ideal value The second wafer part 20 processed in the second chamber unit 104 is supplied to a third chamber unit 300, and each first die processed in the first chamber unit 102 is stacked on one second die 21 of the second wafer part 20 (S15).

The plurality of first dies 11 are aligned on the second wafer part 20 (S16). In this case, the plurality of first dies 11 are aligned in the form of a matrix by an alignment device (not shown). The stacked first dies 11 and second wafer part 20 are pre-bonded in the third chamber unit 300 (S17). In this case, in the third chamber unit 300, the first dies 11 of the first wafer part 10 and the second wafer part 20 are pre-bonded at a temperature of about 20° C. to 30° C., DIW attached to the first wafer part 10 and the second wafer part 20 is evaporated to shield solder portions (not shown) of the first wafer part 10 and the second wafer part 20 from oxygen.

Accordingly, the solder portion including a copper material is prevented from coming into contact with oxygen, thereby preventing the corrosion of the solder portion.

A pre-bonded substrate moves again to the first chamber unit 102 or the second chamber unit 104 (S18). The pre-bonded substrate may be moved by a transfer robot 500.

The pre-bonded substrate (not shown) is dried in the first chamber unit 102 or the second chamber unit 104 (S19). In this case, the pre-bonded substrate may be rotated and dried.

The dried pre-bonded substrate is supplied to the plasma chamber unit 400 by the transfer robot 500 (S20). In the plasma chamber unit 400, the pre-bonded substrate is processed with plasma (S21). In the plasma chamber unit 400, the dried pre-bonded substrate processed with plasma again to remove static electricity. Plasma processing is as described above.

Meanwhile, whenever one layer of the plurality of first dies 11 is stacked and pre-bonded for each second die 21 of the second wafer part 20, the pre-bonded substrate sequentially circulates one time through the plasma chamber unit 400, the first chamber unit 102, the second chamber unit 104, and the third chamber unit 300. When such a process is repeated, in the third chamber unit 300, a plurality of layers of the first dies 11 are stacked and pre-bonded for each second die 21 of the second wafer part 20.

According to the present invention, since a first wafer part is processed in a first chamber unit and a second wafer part is processed in a second chamber unit, the first wafer part and the second wafer part can be simultaneously supplied to a third chamber unit. Accordingly, the first wafer part and the second wafer part can be stacked and pre-bonded in the third chamber unit, thereby considerably improving the processing speed and performance with respect to a substrate.

In addition, according to the present invention, in the third chamber unit, the first wafer part and the second wafer part are pre-bonded at a temperature of about 20° C. to 30° C., water attached to the first wafer part and the second wafer part is evaporated to shield solder portions of the first wafer part and the second wafer part from oxygen. Accordingly, the solder portion including a copper material is prevented from coming into contact with oxygen, thereby preventing the corrosion of the solder portion.

Furthermore, according to the present invention, since a cleaning process is performed in a state in which gaps between dies in the first wafer part widen, foreign materials attached to surfaces of the dies as well as foreign materials positioned in the gaps between the plurality of dies can be easily removed by a cleaning solution. Accordingly, cleaning performance with respect to the first wafer part is considerably improved, thereby considerably reducing a defect rate of the first wafer part.

In addition, according to the present invention, since a ring cover unit is restrained to a vacuum chuck unit as a chucking base is rotated by a chucking rotating part, the first wafer part can be restrained to the vacuum chuck unit using one chucking rotating part. Accordingly, the structure of a wafer processing apparatus can be simplified.

Furthermore, according to the present invention, since a height adjustment part adjusts an installation height of a cover restraining part, it is possible to adjust a height between an upper surface of the ring cover unit and an upper surface of the vacuum chuck unit. Accordingly, as a degree of stretching of an adhesive sheet of the first wafer part is adjusted, the gaps between the plurality of first dies can be adjusted.

While the present invention has been described with reference to embodiments shown in the drawings, these should be considered in a descriptive sense only, and it will be understood by those skilled in the art that various alterations and other equivalent embodiments may be made.

Accordingly, the true scope of protection of the present invention should be defined only by the appended claims.

What is claimed is:

1. A wafer processing apparatus comprising:
   a first chamber unit in which a first wafer part including a retainer ring portion and a plurality of sawn first dies is processed;
   a second chamber unit in which a second wafer part including a wafer part or a carrier substrate is processed; and
   a third chamber unit in which the first dies of the first wafer part processed in the first chamber unit and the second wafer part processed in the second chamber unit are stacked and pre-bonded.

2. The wafer processing apparatus of claim 1, wherein, in the third chamber unit, the plurality of first dies are stacked and pre-bonded for each second die of the second wafer part.

3. The wafer processing apparatus of claim 2, wherein, whenever one layer of the first dies is stacked and pre-bonded for each second die, the first wafer part is cleaned in the first chamber unit, or the second wafer part is cleaned in the second chamber unit.

4. The wafer processing apparatus of claim 1, wherein the second chamber unit includes:
   a second vacuum chuck unit on which the second wafer part is mounted; and
   a second ultrasonic cleaning module configured to spray a cleaning solution onto the second wafer part and apply ultrasonic waves to the cleaning solution to ultrasonically vibrate the cleaning solution.

5. The wafer processing apparatus of claim 4, further comprising a transfer unit disposed in the first chamber unit and configured to receive the first wafer part from a first transfer module and mount the first wafer part on a first vacuum chuck unit.

6. The wafer processing apparatus of claim 4, further comprising:
   a first ionizer disposed in the first chamber unit and configured to spray deionized water (DIW) including positive ions and negative ions onto the first wafer part and remove static electricity; and
   a second ionizer disposed in the second chamber unit and configured to spray DIW including positive ions and negative ions onto the second wafer part and remove static electricity.

7. The wafer processing apparatus of claim 1, wherein:
   the first chamber unit further includes an expander module; and
   the expander module includes an expander moving part disposed in the first chamber unit, an expander head installed at the expander moving part, and a plurality of expander arms connected to the expander head to hold and move a ring cover unit and configured to press the ring cover unit such that a chucking module restrains the ring cover unit to a first vacuum chuck unit.

8. The wafer processing apparatus of claim 7, wherein the expander head includes:
   an expander casing connected to the expander moving part;
   a plurality of expander sliders coupled to the expander casing to be radially movable and each connected to one of the expander arms;
   an expander rod disposed inside the expander casing to move the plurality of expander sliders; and
   an expander driving part disposed in the expander casing to move the expander rod.

9. The wafer processing apparatus of claim 8, wherein the expander casing includes:
   a casing body having a movement space, in which the expander rod moves, formed therein;
   a first blocking plate configured to block one side of the casing body; and
   a second blocking plate which blocks the other side of the casing body and has a movement hole, into which the expander rod is movably inserted, formed therein.

10. The wafer processing apparatus of claim 8, wherein the expander rod includes:
    a moving disk portion movably installed in a movement space of the expander casing;
    a plunger portion connected to the moving disk portion to be inserted into a movement hole of the expander casing; and
    a push portion connected to the plunger portion and the expander slider to move the expander slider as the plunger portion moves.

11. The wafer processing apparatus of claim 8, wherein the expander arm includes:
    an arm member connected to the expander slider; and
    a catch portion disposed at the arm member to restrain the ring cover unit.

12. The wafer processing apparatus of claim 8, wherein the chucking module includes:
    a chucking base installed in the first vacuum chuck unit;
    a chucking rotating part connected to the chucking base to rotate the chucking base;
    a plurality of chucking link parts which are each radially connected to the chucking base and move when the chucking base rotates; and
    a plurality of cover restraining parts each connected to one of the chucking link parts to restrain the ring cover unit to the first vacuum chuck unit when the chucking link parts move.

13. The wafer processing apparatus of claim 1, wherein:
    the first chamber unit includes a first ultrasonic cleaning module; and
    the first ultrasonic cleaning module includes a lifting arm driving part, a lifting arm connected to the lifting arm driving part to be vertically moved by the lifting arm driving part, a swing part connected to the lifting arm to rotate the lifting arm, and an ultrasonic cleaning part connected to the lifting arm and configured to spray a cleaning solution onto the first wafer part and apply ultrasonic waves to the cleaning solution.

14. The wafer processing apparatus of claim 13, wherein the ultrasonic cleaning part includes:
    a cleaning head connected to the lifting arm and immersed in the cleaning solution;
    an ultrasonic wave generator disposed inside the cleaning head to apply the ultrasonic waves to the cleaning solution;
    a voltage applying part disposed inside the cleaning head to apply a voltage to the ultrasonic wave generator;
    an internal pressure forming part configured to form pressure higher than atmospheric pressure inside the cleaning head; and
    a cleaning solution spray part formed in the cleaning head to spray the cleaning solution onto the first wafer part.

15. The wafer processing apparatus of claim 14, wherein an inflow side of a lower surface of the cleaning head into which the cleaning solution flows is formed at a higher level than an outflow side thereof of which the cleaning solution flows out.

16. A wafer processing method comprising:
processing a first wafer part including a retainer ring portion and a plurality of sawn first-sawve dies in a first chamber unit;
processing a second wafer part including a wafer part and a carrier substrate in a second chamber unit; and
stacking and pre-bonding the first dies processed in the first chamber unit and the second wafer part processed in the second chamber unit in a third chamber unit.

17. The wafer processing method of claim 16, wherein, in the third chamber unit, the plurality of first dies are stacked and pre-bonded for each second die of the second wafer part.

18. The wafer processing method of claim 16, wherein, in the first chamber unit, a first ultrasonic cleaning module sprays a cleaning solution onto the first wafer part and applies ultrasonic waves to the cleaning solution to ultrasonically vibrate the cleaning solution.

19. The wafer processing method of claim 16, wherein, in the second chamber unit, a second ultrasonic cleaning module sprays a cleaning solution onto the second wafer part and applies ultrasonic waves to the cleaning solution to ultrasonically vibrate the cleaning solution.

20. The wafer processing method of claim 16, wherein:
a first ionizer installed in the first chamber unit sprays deionized water (DIW) including positive ions and negative ions onto the first wafer part to remove static electricity; and
a second ionizer installed in the second chamber unit sprays DIW including positive ions and negative ions onto the second wafer part to remove static electricity.

* * * * *